United States Patent
Horiuchi et al.

(10) Patent No.: US 9,048,242 B2
(45) Date of Patent: Jun. 2, 2015

(54) SEMICONDUCTOR DEVICE MANUFACTURING METHOD, SEMICONDUCTOR DEVICE, AND WIRING BOARD

(75) Inventors: Akio Horiuchi, Nagano (JP); Toshiji Miyasaka, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 554 days.

(21) Appl. No.: 13/162,071

(22) Filed: Jun. 16, 2011

(65) Prior Publication Data

US 2011/0244631 A1    Oct. 6, 2011

Related U.S. Application Data

(62) Division of application No. 12/372,198, filed on Feb. 17, 2009, now Pat. No. 8,217,509.

(30) Foreign Application Priority Data

Feb. 18, 2008 (JP) ................................. 2008-036235

(51) Int. Cl.
*H01L 21/00* (2006.01)
*H01L 23/538* (2006.01)
*H01L 23/00* (2006.01)

(52) U.S. Cl.
CPC ............ *H01L 23/5389* (2013.01); *H01L 24/97* (2013.01); *H01L 2224/04105* (2013.01);
(Continued)

(58) Field of Classification Search
USPC ......... 438/613, 118–123, 106–108, 125–127, 438/597–599, 456, 110, 675, 781, 771, 780, 438/725, 788, 789, 275, 276; 257/E21.499, 257/E21.506, 692, 698, 733, E23.06, 257/E21.505, E21.503
See application file for complete search history.

(56) References Cited

U.S. PATENT DOCUMENTS 6,271,469 B1    8/2001    Ma et al.
6,282,346 B1 *  8/2001    Richter et al. ................. 385/52
(Continued)

FOREIGN PATENT DOCUMENTS

JP    6-236941      8/1994
JP    2001-015650   1/2001
(Continued)

OTHER PUBLICATIONS

Machine translation of JP 2001-015650, published Jan. 2001, pp. 1-10.*
(Continued)

*Primary Examiner* — Robert Bachner
(74) *Attorney, Agent, or Firm* — Drinker Biddle & Reath LLP

(57) ABSTRACT

In a semiconductor device manufacturing method, a semiconductor chip is mounted on a support board so as to expose a side of the semiconductor chip on which a plurality of terminal electrodes are provided. An insulating layer is formed so as to cover the side of the semiconductor chip on which the terminal electrodes are provided. Through electrodes connecting to the terminal electrodes and piercing the insulating layer are formed. Metal wirings connecting to the through electrodes are formed on the insulating layer. External terminal electrodes connecting the metal wiring are formed. Second spacing, spacing between the adjacent external terminal electrodes, is larger than first spacing, spacing between the adjacent terminal electrodes.

3 Claims, 34 Drawing Sheets

(52) U.S. Cl.
CPC ......... *H01L2224/16* (2013.01); *H01L 2224/20* (2013.01); *H01L 2224/211* (2013.01); *H01L 2224/24227* (2013.01); *H01L 2224/73267* (2013.01); *H01L 2224/92244* (2013.01); *H01L 2924/01027* (2013.01); *H01L 2924/01078* (2013.01); *H01L 2924/01079* (2013.01); *H01L 2924/01322* (2013.01); *H01L 2924/15153* (2013.01); *H01L 2924/15165* (2013.01); *H01L 2924/1517* (2013.01); *H01L 2924/15174* (2013.01); *H01L 2924/15311* (2013.01); *H01L 2924/16195* (2013.01); *H01L 2224/12105* (2013.01); *H01L 2224/32225* (2013.01); *H01L 2224/32245* (2013.01); *H01L 2224/97* (2013.01)

(56) References Cited

U.S. PATENT DOCUMENTS

| | | | |
|---|---|---|---|
| 6,309,912 B1 * | 10/2001 | Chiou et al. | 438/118 |
| 6,350,706 B1 * | 2/2002 | Howard | 438/781 |
| 7,341,934 B2 * | 3/2008 | Hsu et al. | 438/613 |
| 7,388,293 B2 | 6/2008 | Fukase et al. | |
| 7,550,322 B2 * | 6/2009 | Kimura | 438/126 |
| 2002/0062946 A1 * | 5/2002 | Murayama et al. | 165/80.3 |
| 2003/0133274 A1 | 7/2003 | Chen et al. | |
| 2003/0157747 A1 * | 8/2003 | Chen et al. | 438/106 |
| 2007/0257376 A1 * | 11/2007 | Shimokawa et al. | 257/778 |

FOREIGN PATENT DOCUMENTS

| | | |
|---|---|---|
| JP | 2002-16173 | 1/2002 |
| JP | 2003-7896 | 1/2003 |
| TW | 489016 | 6/2002 |
| WO | WO 01/00508 A1 | 1/2001 |

OTHER PUBLICATIONS

Office Action issued on Sep. 30, 2014 in the corresponding Taiwanese Patent Application No. 098105083, and English translation.

* cited by examiner

SEMICONDUCTOR DEVICE MANUFACTURING METHOD, SEMICONDUCTOR DEVICE, AND WIRING BOARD

This is a divisional application of copending application Ser. No. 12/372,198, filed on Feb. 17, 2009, which is incorporated by reference herein in its entirety.

TECHNICAL FIELD

The present disclosure relates to a semiconductor device manufacturing method, a semiconductor device, and a wiring board. More specifically, the present disclosure relates to a semiconductor device manufacturing method, a semiconductor device, and a wiring board for making terminal electrode spacing of a semiconductor chip correspond to terminal electrode spacing of a wiring board.

RELATED ART

With the coming of a ubiquitous network society, demands for reduction in size and weight as well as speedup and higher performance of electronic devices grow. Most of all, higher integration of a semiconductor chip forming an IC such as a system LSI advances increasingly combined with the advance of the finer design rule technology of a semiconductor. The number of terminal electrodes (pins) of a semiconductor chip increases with the higher integration.

Thus, as the number of pins of a semiconductor chip increases more and more, the terminal electrode spacing (pitch) of the semiconductor chip becomes narrower. Narrow pitches of 100 µm, 70 µm, 50 µm, etc., become general, for example, as a narrow pitch of about 60 µm becomes necessary in the design rule 0.35-µm generation.

On the other hand, in a wiring board on which such a semiconductor chip is mounted, the spacing between the adjacent terminal electrodes is large (about 100 µm to 200 µm) as represented by C4 bump pitch. It is difficult to manufacture a wiring board compatible with the narrow pitch of 100 µm, 70 µm, 50 µm, etc., mentioned above. Therefore, an art for mounting a semiconductor chip having terminal electrodes at narrower pitches with the increasing number of pins mentioned above on a wiring board and making electric connection becomes important.

Generally, an important method as a mounting method of mounting a semiconductor chip with an increasing number of pins on a wiring board and making electric connection with the wiring board is flip chip connection. A related-art general mounting technique is wire bonding of wiring with terminals using a thin metal wire with the circuit side of a semiconductor chip facing upward. However, in the flip chip connection, a semiconductor chip is connected to a wiring board using solder and metal terminals (bumps) with the circuit side of the semiconductor chip facing downward, thereby making electric connection. The flip chip connection has an excellent electric characteristic and is compatible with speedup and higher density because the wiring length is shorter than that of the wiring bonding. Since terminals can also be placed two-dimensionally just below the semiconductor chip, the flip chip connection includes a feature that it is easy to increase the number of pins (the number of terminals), for example, to several thousand pins. Further, the flip chip connection is also excellent in heat dissipation because the structure enables heat to be dissipated from the rear of the semiconductor chip.

If the terminal electrode spacing of a semiconductor chip is small as compared with that of a wiring board, it is difficult to mount the semiconductor chip directly on the wiring board. FIG. 1 is a schematic sectional view of a semiconductor chip 120 and a wiring board 170 when spacing D1 between terminal electrodes 140 of the semiconductor chip 120 is small as compared with spacing D2 between terminal electrodes 150 of the wiring board 170. In such a case, the following mounting method is conducted: A high-density multilayer wiring board with insulating layers and wiring layers deposited complicatedly is placed between a semiconductor chip and a wiring board, the semiconductor chip is mounted on the high-density multilayer wiring board according to flip chip, and the high-density multilayer wiring board with the semiconductor chip mounted thereon is mounted on the general wiring board (mother board) according to BGA bonding. This is FCBGA (Flip Chip Ball Grid Array). In FCBGA, the mounting method of mounting the high-density multilayer wiring board on the general wiring board is BGA; PGA (Pin Grid Array) or LGA (Line Grid Array) rather than BGA may be used and the mounting method is called FCPGA or FCLGA.

However, FCBGA, etc., as described above involves a problem in that a high-density multilayer wiring board with insulating layers and wiring layers deposited complicatedly must be used.

As a semiconductor device manufacturing method capable of electrically connecting a semiconductor chip directly to a wiring board without using the high-density multilayer wiring board having the complicated deposition structure, a method of embedding a semiconductor chip directly in a wiring board and mounting the semiconductor chip in the wiring board and a method of mounting a semiconductor device mounted on aboard for mechanically supporting a semiconductor chip and having a function of conducting heat on a wiring board using solder balls, etc., are available.

The method of embedding a semiconductor chip directly in a wiring board is a method of forming a recess to incorporate a semiconductor chip in a wiring board. Patent document 1 discloses a method of incorporating a semiconductor chip in a multilayer wiring board and wiring terminal electrodes of the semiconductor chip in the wiring board through a transition layer.

The method of mounting a semiconductor device mounted on a board for mechanically supporting a semiconductor chip and having a function of conducting heat on a wiring board using solder balls, etc., is a method of mounting on a predetermined board using a predetermined mounting method, forming external terminal electrodes corresponding to terminal electrodes of a related-art wiring board, and mounting a semiconductor chip on a wiring board using amounting method of solder balls, etc. Patent document 2 discloses an example of a semiconductor device manufacturing method of forming a recess of a metal bottom plate and a resin composite frame, embedding a semiconductor chip in the recess, providing an insulating layer, and forming external terminal electrodes corresponding to terminal electrodes of a related-art wiring board. Patent document 3 discloses an example of a semiconductor device manufacturing method of selecting a mechanically stable board having high heat conductivity, making a hollow in the board, attaching a semiconductor chip, providing a thin film overlay made up of wiring connected to terminal electrodes of the semiconductor chip and an insulting layer, and connecting the semiconductor chip and wiring board.

[Patent document 1] Japanese Patent Laid-Open No. 2003-7896
[Patent document 2] Japanese Patent Laid-Open No. 2002-16173

[Patent document 3] Japanese Patent Laid-Open No. 236941/1994

However, the semiconductor device manufacturing method, the semiconductor device, and the wiring board used in the related art involve the following problems:

First, the method disclosed in patent document 1 involves a problem in that it becomes impossible to use any desired wiring board. Specifically, the method involves a problem in that any desired wiring board cannot be used because the recess to incorporate a semiconductor chip must be formed on the surface of a wiring board by counter boring, etc., and a wiring board made of a material and a structure to allow the recess to be easily made in the structure must be provided.

The method disclosed in patent document 2 involves a problem in that a step of providing a frame becomes necessary. Specifically, a step of forming a package material made of a resin composite with a hole corresponding to the shape of a semiconductor chip and press-stacking a frame made of the package material formed with the hole on a bottom plate made of a metal plate becomes necessary. In addition, then an insulating film is provided on the top face and thus the thickness of the frame must be made equal to the thickness of the semiconductor chip. There is a problem in the stability and the reliability of the working steps and consequently, there is a problem of degrading the mechanical strength supporting the semiconductor chip and the heat conductivity for dissipating heat generated from the semiconductor chip.

Further, the method disclosed in patent document 3 involves a problem in that a forming method of the hollow is not considered. Specifically, a method of milling the hollow to a size slightly larger than the semiconductor chip is only disclosed and the method lacks accuracy of finishing and reliability. It is difficult to design connection terminals as desired in response to a related-art wiring board having general terminal spacing of C4 bump pitch, etc.

SUMMARY

Exemplary embodiments of the present invention provide a semiconductor device manufacturing method, a semiconductor device, and a wiring board capable of making terminal electrode spacing of a semiconductor chip correspond to general terminal spacing of C4 bump pitch, etc., without using a high-density wiring board of a complicated structure and consequently enhancing the mechanical strength for supporting the semiconductor chip and the heat conductivity for dissipating heat generated from the semiconductor chip while using a related-art wiring board.

To the end, according to the invention, there are provided the following means:

A semiconductor device manufacturing method according to a first aspect of the invention is a semiconductor device manufacturing method having:

a semiconductor chip mounting step of mounting a semiconductor chip on a support board so as to expose a side of the semiconductor chip on which a plurality of terminal electrodes are provided;

an insulating layer forming step of forming an insulating layer so as to cover the side of the semiconductor chip on which the terminal electrodes are provided;

a through electrode forming step of forming through electrodes which connect to the terminal electrodes and pierce the insulating layer;

a metal wiring forming step of forming metal wiring connecting to the through electrodes on the insulating layer; and an external terminal electrode forming step of forming external terminal electrodes for connecting the metal wiring to the outside on the metal wiring, wherein spacing between the adjacent external terminal electrodes is larger than spacing between the adjacent terminal electrodes.

A second aspect of the invention is characterized by the fact that in the semiconductor device manufacturing method according to the first aspect of the invention, the semiconductor chip mounting step is to adhere the semiconductor chip to the support board with an adhesive.

A third aspect of the invention is characterized by the fact that in the semiconductor device manufacturing method according to the first or second aspect of the invention, the support board is a copper plate or a kovar plate.

A fourth aspect of the invention is characterized by the fact that in the semiconductor device manufacturing method according to anyone of the first to third aspects of the invention, the insulating layer is an epoxy-based resin or a polyimide-based resin.

A fifth aspect of the invention is characterized by the fact that in the semiconductor device manufacturing method according to the first aspect of the invention, the semiconductor chip mounting step has:

a metal film forming step of forming a first metal film on the support board and a second metal film on the first metal film;

a fit hole forming step of forming the second metal film with a fit hole to fit the semiconductor chip; and a fit and adhesion step of fitting the semiconductor chip into the fit hole and adhering the semiconductor chip to the fit hole with an adhesive.

A sixth aspect of the invention is characterized by the fact that in the semiconductor device manufacturing method according to the fifth aspect of the invention, the fit hole forming step is to deposit a dry film resist on the second metal film, expose and develop the dry film resist to form a resist pattern corresponding to the fit hole, and etch the second metal film formed with the resist pattern.

A seventh aspect of the invention is characterized by the fact that in the semiconductor device manufacturing method according to the fifth or sixth aspect of the invention, the support board is any one of a copper plate, a kovar plate, a nickel plate, or a glass epoxy board.

An eighth aspect of the invention is characterized by the fact that in the semiconductor device manufacturing method according to any one of the fifth to seventh aspects of the invention, the first metal film contains gold.

A ninth aspect of the invention is characterized by the fact that in the semiconductor device manufacturing method according to any one of the fifth to eighth aspects of the invention, the second metal film is copper.

A tenth aspect of the invention is characterized by the fact that in the semiconductor device manufacturing method according to the first aspect of the invention, the semiconductor chip mounting step has:

a fit hole forming step of forming the support board with a fit hole to fit the semiconductor chip; and a fit and adhesion step of fitting the semiconductor chip into the fit hole and adhering the semiconductor chip to the fit hole with an adhesive.

An eleventh aspect of the invention is characterized by the fact that in the semiconductor device manufacturing method according to the tenth aspect of the invention, the fit hole forming step is to deposit a dry film resist on the support board, expose and develop the dry film resist to form a resist pattern corresponding to the fit hole, and etch the support board formed with the resist pattern.

A twelfth aspect of the invention is characterized by the fact that in the semiconductor device manufacturing method according to the tenth or eleventh aspect of the invention, the support board is a copper plate or a kovar plate.

According to a thirteenth aspect of the invention, there is provided a semiconductor device having:

a semiconductor chip;

a support board which supports the semiconductor chip;

a plurality of terminal electrodes provided on semiconductor chip;

a plurality of external terminal electrodes which connect the terminal electrodes to the outside; and a fan out section which electrically connects the terminal electrodes and the external terminal electrodes, the fan out section including an insulating layer which covers the terminal electrodes;

through electrodes which connect to the terminal electrodes and pierce the insulating layer; and metal wirings which connect to the through electrodes and are formed on the insulating layer, wherein spacing between the adjacent external terminal electrodes is larger than spacing between the adjacent terminal electrodes.

A fourteenth aspect of the invention is characterized by the fact that in the semiconductor device according to the thirteenth aspect of the invention, the semiconductor chip is adhered to the support board with an adhesive and a side of the semiconductor chip on which the terminal electrodes are provided is covered with the insulating layer.

A fifteenth aspect of the invention is characterized by the fact that the semiconductor device according to the thirteenth or fourteenth aspect of the invention, further comprises:

a first metal film provided on said support board; and a second metal film provided on the support board through the first metal film, the second metal film having a fit hole to fit the semiconductor chip, wherein the semiconductor chip is fitted into the fit hole so that the side of the semiconductor chip on which the terminal electrodes are provided is exposed, and is adhered to the fit hole with an adhesive.

A sixteenth aspect of the invention is characterized by the fact that in the semiconductor device according to the thirteenth or fourteenth aspect of the invention, the support board is formed with a fit hole to fit the semiconductor chip, and that the semiconductor chip is fitted into the fit hole so that the side of the semiconductor chip on which the terminal electrodes are provided is exposed, and is adhered to the fit hole with an adhesive.

A seventeenth aspect of the invention is characterized by the fact that in the semiconductor device according to any one of the thirteenth to sixteenth aspects of the invention, a plurality of the semiconductor chips are mounted.

According to an eighteenth aspect of the invention, there is provided a wiring board comprising:

a semiconductor device according to any one of the thirteenth to seventeenth aspects of the invention;

a wiring board substrate on which the semiconductor device is mounted;

wiring board terminal electrodes provided on the wiring board substrate in a one-to-one correspondence with the external terminal electrodes, wherein the external terminal electrodes and the wiring board terminal electrodes are electrically connected.

According to the invention, the terminal electrode spacing of the semiconductor chip is made to correspond to general terminal spacing of C4 bump pitch, etc., whereby a related-art wiring board can be used and the mechanical strength for supporting the semiconductor chip and the heat conductivity for dissipating heat generated from the semiconductor chip can be enhanced.

Other features and advantages may be apparent from the following detailed description, the accompanying drawings and the claims.

DETAILED DESCRIPTION

The best mode for carrying out the invention will be discussed with the accompanying drawings.

First Embodiment

A semiconductor device according to a first embodiment of the invention will be discussed with reference to FIGS. 2 to 3B.

To begin with, the semiconductor device according to the embodiment will be discussed with reference to FIG. 2.

Figure 1:
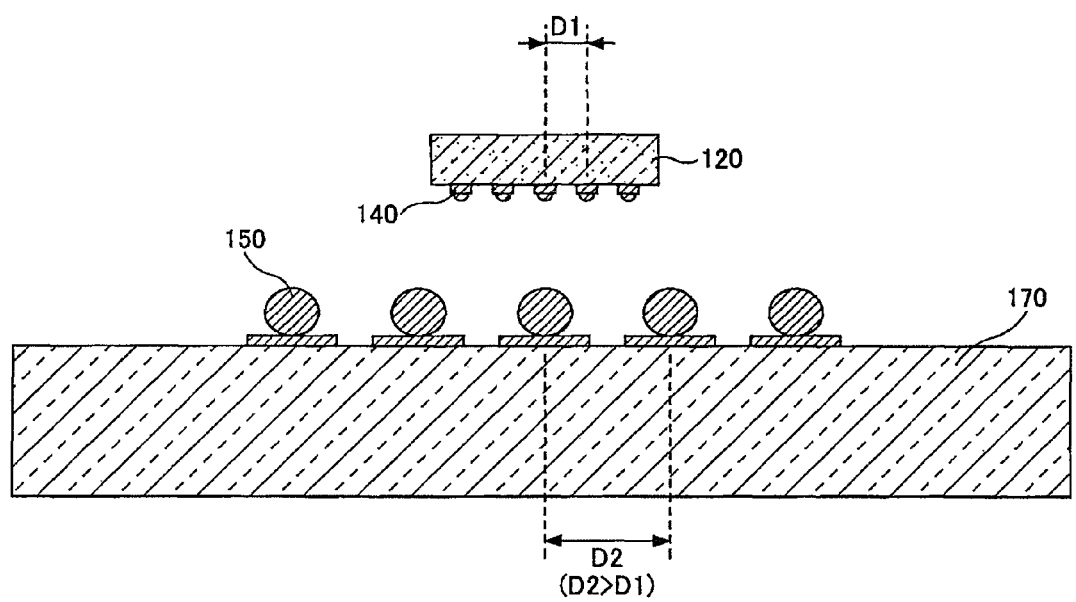
FIG. 1 is a drawing to describe a related-art wiring board and is a sectional view to schematically show a semiconductor chip and a wiring board when terminal electrode spacing of the semiconductor chip is small as compared with terminal electrode spacing of the wiring board.
Figure 2:
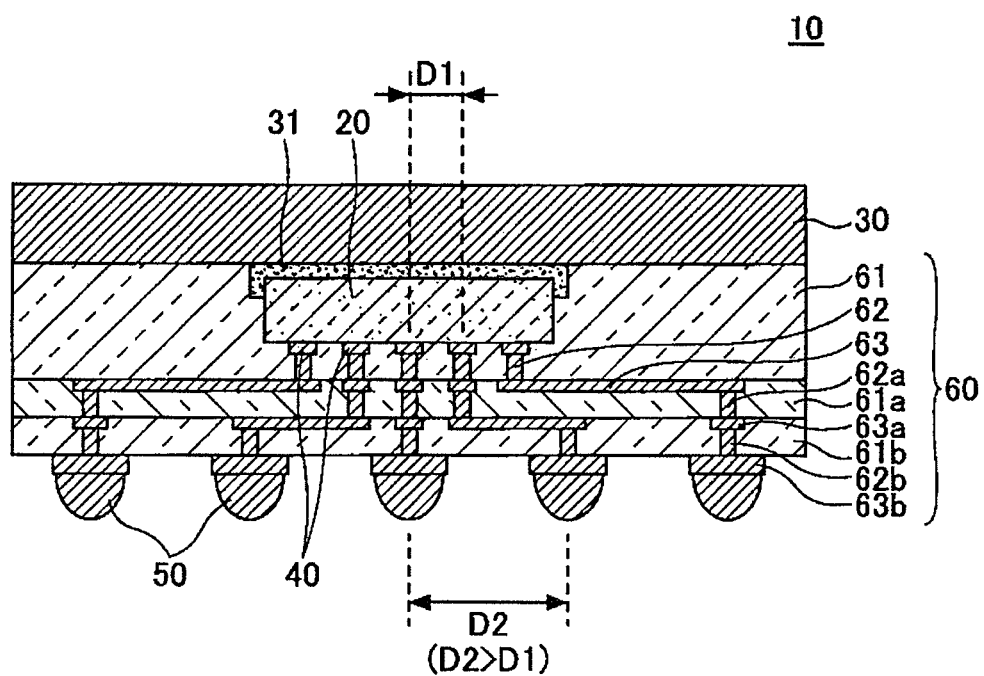
FIG. 2 is a sectional view to schematically show a semiconductor device according to a first embodiment of the invention.

FIG. 2 is a sectional view to schematically show the semiconductor device according to the embodiment of the invention.

As shown in FIG. 2, a semiconductor device 10 according to the embodiment has a semiconductor chip 20, a support board 30, terminal electrodes 40, external terminal electrodes 50, and a fan out section 60.

The semiconductor chip 20 has an electric function of the semiconductor device 10. It has the terminal electrodes 40 for electrically connecting to the outside of the semiconductor chip 20. The spacing between the adjacent terminal electrodes 40 is first spacing D1. For example, D1 can be set to about 50 to 100 μm.

The opposite side of the semiconductor chip 20 to the side on which the terminal electrodes 40 are provided is adhered to the support board 30 with an adhesive 31. The support board 30 supports the semiconductor chip 20 and ensures the mechanical strength of the semiconductor device 10 and at the same time, dissipates heat generated in the semiconductor chip 20.

The external terminal electrodes 50 are provided on a surface of the fan out section 60. The external terminal electrodes 50 are terminal electrodes for electrically connecting to the outside of the semiconductor device 10. The spacing between the adjacent external terminal electrodes 50 is second spacing D2. For example, D2 can be set to about 150 to 180 μm.

In all of the external terminal electrodes 50, the spacing D2 between the adjacent external terminal electrodes 50 is larger than the spacing D1 between the adjacent terminal electrodes 40 in all of the adjacent terminal electrodes 40. That is, the minimum spacing between the adjacent external terminal electrodes 50 is larger than the maximum spacing between the adjacent terminal electrodes 40.

The fan out section 60 has an insulating layer 61, through electrodes 62, and metal wiring 63. It connects the terminal electrodes 40 having the first spacing D1 and the external terminal electrodes 50 having the second spacing D2.

The insulating layer 61 is provided so as to cover the semiconductor chip 20 and the terminal electrodes 40 provided on the semiconductor chip 20. The through electrodes 62 are connected to the terminal electrodes 40 and are provided so as to pierce the insulating layer 61. The metal wiring 63 is connected to the through electrodes 62 and is wiring on the surface of the insulating layer 61.

The insulating layer 61 covers the side formed with the terminal electrodes 40 of the semiconductor chip 20 adhered to the support board 30 with the adhesive 31. As shown in FIG. 2, the insulating layer 61 can cover the side faces of the semiconductor chip 20.

The insulating layer 61, the through electrodes 62, and the metal wiring 63 are formed as at least one layer each. When D1 and D2 almost equal, the insulating layer 61, the through electrodes 62, and the metal wiring 63 are formed at least one layer each and the terminal electrodes 40 and the external terminal electrodes 50 can be electrically connected. However, for example, if D2 is considerably larger than D1 as D2 is about twice D1, the insulating layer 61, the through electrodes 62, and the metal wiring 63 can be formed as more than one layer each to avoid crossing of wiring. In the embodiment, as shown in FIG. 2, the insulating layer 61, the through electrodes 62, and the metal wiring 63 are formed as three layers each as insulating layers 61, 61a, and 61b, through electrodes 62, 62a, and 62b, and metal wiring 63, 63a, and 63b in order from the support board 30 and the semiconductor chip 20. The external terminal electrodes 50 are provided so as to be connected to the metal wiring 63b provided on the surface of the fan out section 60.

Next, a fan out function of widening the first spacing D1 between the adjacent terminal electrodes 40 of the semiconductor chip 20 to the second spacing D2 between the adjacent external terminal electrodes 50, a function of ensuring the mechanical strength, and a function of ensuring heat conductivity according to the semiconductor device 10 according to the embodiment will be discussed.

First, the fan out function will be discussed.

To begin with, the through electrodes 62 are connected to the terminal electrodes 40 and are formed vertically and thus the spacing between the adjacent through electrodes 62 is the same as the first spacing D1.

Next, of the five parts of the metal wiring 63 connected to the five through electrodes 62, the center three parts of the metal wiring 63 except the left and right parts are formed as connected to the tops of the through electrodes 62 and thus the spacing between the adjacent parts of the metal wiring 63 is the same as the first spacing D1. However, the parts of the metal wiring 63 connected to the left and right two through electrodes 62 are provided from the positions of the left and right two through electrodes 62 to the left and the right to widen the first spacing D1 to the second spacing D2. In the embodiment, for example, the two parts of the metal wiring 63 on the left and the right are provided to the distance of 2×D2 from the center through electrode.

Next, the through electrodes 62a are connected to the metal wiring 63 and are formed vertically and thus the spacing between the adjacent through electrodes 62a of the center three except the left and right through electrodes 62a is the same as the first spacing D1, and each of the through electrodes 62a on the left and the right has spacing of 2×D2 from the center through electrode 62a.

Next, of the five parts of the metal wiring 63a connected to the five through electrodes 62a, the three parts of the metal wiring 63a at the center and on the left and the right are formed as connected to the tops of the through electrodes 62a. However, the two parts of the metal wiring 63a positioned second from the left and the right are provided from the positions of the corresponding through electrodes 62a to the left and the right to widen the first spacing D1 to the second spacing D2. In the embodiment, for example, the two parts of the metal wiring 63a positioned second from the left and the right are provided to the distance of D2 from the center through electrode.

Next, the through electrodes 62b are connected to the metal wiring 63b and are formed vertically. Thus, the spacing between the adjacent through electrodes 62b of the five through electrodes 62b is the same as the second spacing D2.

Next, the five parts of the metal wiring 63b are formed as connected to the tops of the five through electrodes 62b. Thus, the spacing between the adjacent parts of the five parts of the metal wiring 63b is the same as the second spacing D2.

Last, the five external terminal electrodes 50 are formed as connected to the five parts of the metal wiring 63b. Therefore, the first spacing D1, the spacing between the terminal electrodes 40, is widened to the second spacing D2 and the terminal electrodes 40 are connected to the external terminal electrodes 50.

As described above, the fan out function of widening the first spacing D1, the spacing between the adjacent terminal electrodes 40, to the second spacing D2, the spacing between the adjacent external terminal electrodes 50, is provided.

Next, the function of ensuring the mechanical strength and the function of ensuring heat conductivity, of the semiconductor device 10 will be discussed.

The semiconductor device 10 has the semiconductor chip 20, the terminal electrodes 40, and the external terminal electrodes 50 as many as the number of the terminal electrodes 40. The second spacing D2, the spacing between the adjacent external terminal electrodes 50, is large as compared with the first spacing D1, the spacing between the adjacent terminal electrodes 40. Therefore, the area of the semiconductor device 10 is large as compared with that of the semiconductor chip 20. The mechanical strength of the semiconductor device 10 large as compared with the semiconductor chip 20 is ensured mainly by the support board 30. In the semiconductor device 10 according to the embodiment, the adhesive 31 and the insulating layer 61 are used to fix the semiconductor chip 20 to the support board 30, so that the mechanical strength is also ensured by the adhesive 31 and the insulating layer 61.

On the other hand, the semiconductor chip 20 is brought into thermal contact with the support board 30 through the adhesive 31 and the insulating layer 61. The semiconductor chip 20 is electrically connected and is also thermally connected to the external terminal electrodes 50 through the through electrodes 62, 62a, and 62b and the metal wiring 63, 63a, and 63b from the terminal electrodes 40. Therefore, in the semiconductor device 10 according to the embodiment, the heat conductivity for dissipating heat generated in the semiconductor chip 20 is ensured.

Next, preferred material for forming the semiconductor device 10 will be discussed.

First, material of the support board 30 is not limited; however, for example, a metal plate of a copper plate, an aluminum plate, a kovar plate, etc., can be used. Material of the insulating layer 61 is not limited; however, for example, an epoxy-based resin, a phenol-based resin, a phenoxy resin, a polyimide-based resin, a polyphenylene-based resin, a polyolefin-based resin, or a fluorine-based resin can be used. Material of the through electrodes 62 is not limited; however, for example, copper can be used. Material of the adhesive 31 is not limited; however, for example, a high heat conductive epoxy adhesive with silver added to an epoxy resin or gold silicon can be used. Material of the metal wiring 63 is not limited; however, for example, tin, chromium, titanium, nickel, zinc, cobalt, gold, copper, etc., can be used. Material of the external terminal electrodes 50 is not limited; however, for example, solder can be used.

Manufacturing Method of Semiconductor Device According to First Embodiment

Next, a manufacturing method of the semiconductor device according to the embodiment will be discussed with reference to FIGS. 3A and 3B.

Figure 3A:
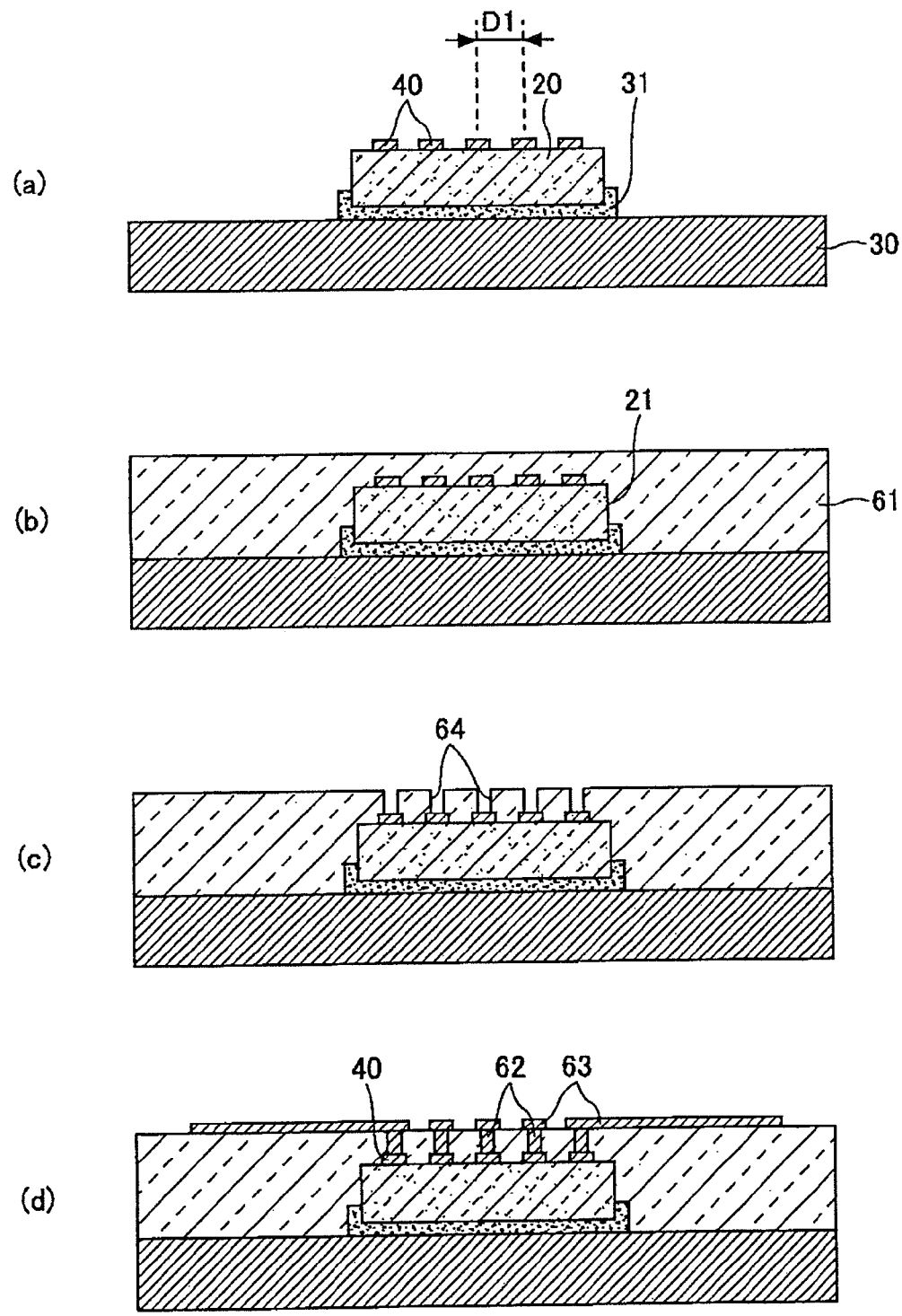
FIG. 3A is a drawing to schematically show a manufacturing method of the semiconductor device according to the first embodiment of the invention (No. 1)
Figure 3B:
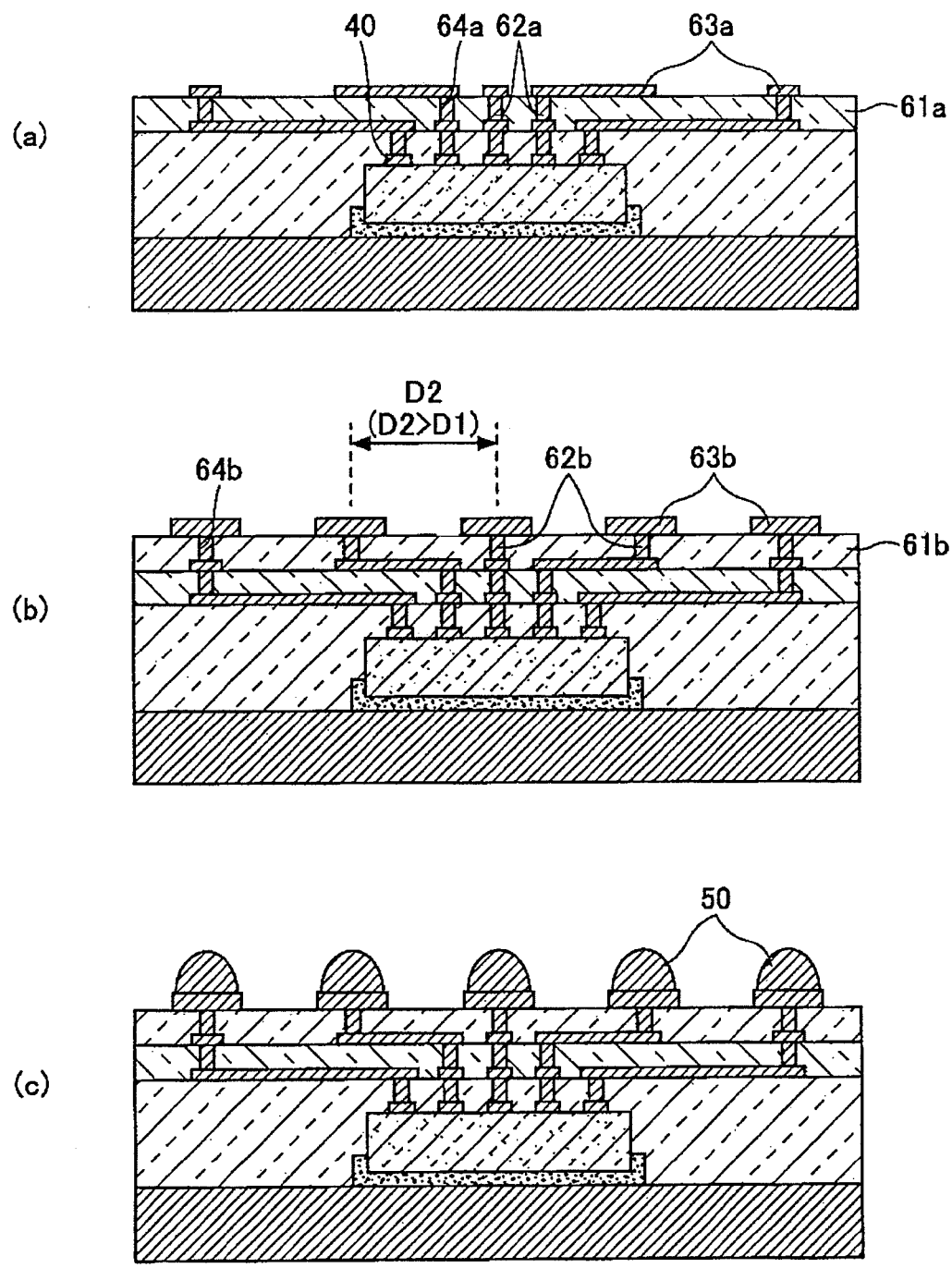
FIG. 3B is a drawing to schematically show the manufacturing method of the semiconductor device according to the first embodiment of the invention (No. 2)

FIGS. 3A and 3B are drawings to schematically show the manufacturing method of the semiconductor device according to the embodiment.

First, in a semiconductor chip mounting step shown in FIG. 3A (a), a semiconductor chip 20 is adhered onto a support board 30. In this case, an adhesive 31 is previously applied to an adhesion face to which the semiconductor chip 20 is to be adhered on the support board 30 made of a copper plate having a thickness of 100 to 1000 μm, for example, and the semiconductor chip 20 is placed and is adhered onto the support board 30 to which the adhesive 31 is applied. The semiconductor chip 20 is adhered to the support board 30 so that the side on which terminal electrodes 40 are provided is exposed (face up).

Next, in an insulating layer forming step shown in FIG. 3A (b), an insulating layer 61 made of an epoxy-based resin or a polyimide-based resin is formed. At this time, the insulating layer 61 is formed so that the side of the semiconductor chip 20 having a height of 100 to 800 μm, for example, on which the terminal electrodes 40 are provided is further covered in a thickness of 5 to 30 μm, for example. That is, the thickness of the insulating layer 61 is the total of the height of the semiconductor chip 20, for example, 100 to 800 μm, and the thickness covering the terminal electrodes 40 of the semiconductor chip 20, for example, 5 to 30 μm, and the terminal electrodes 40 of the semiconductor chip 20 are covered with the insulating layer 61. The insulating layer 61 can also be formed so as to cover side faces 21 of the semiconductor chip 20 compactly. In the embodiment, the side faces 21 of the semiconductor chip 20 are also covered compactly with the insulating layer 61 as shown in FIG. 3A (b).

Next, in a step shown in FIG. 3A (c), the insulating layer 61 is formed with through holes 64 reaching the terminal electrodes 40, for example, using a laser although the method is not limited.

Next, in a through electrode forming step and a metal wiring forming step shown in FIG. 3A (d), through electrodes 62 are formed so as to fill in the through holes 64 and metal wiring 63 to be connected to the through electrodes 62 is formed, for example, according to a semiadditive process.

At this time, the parts of the metal wiring 63 connected to the two outermost terminal electrodes 40 on the left and the right, of the five terminal electrodes 40 shown in FIG. 3A (d) are disposed so as to spread to both the left and right sides to widen the terminal spacing.

Next, in steps shown in FIGS. 3B (a) and 3B (b), forming the insulating layer 61, forming the insulating layer 61 with the through holes 64, and forming the through electrodes 62 and the metal wiring 63 are repeated twice. However, in the first repetition, the insulating layer 61a, the through holes 64a, the through electrodes 62a, and the metal wiring 63a are formed, and in the second repetition, the insulating layer 61b, the through holes 64b, the through electrodes 62b, and the metal wiring 63b are formed. The insulating layer 61a, 61b can be formed in a thickness of 5 to 30 μm, for example. The parts of the metal wiring 63a connected to the two terminal electrodes positioned second from the left and the right, of the five terminal electrodes 40 shown in FIG. 3B (a) are disposed so as to spread to both the left and right sides to widen the terminal spacing. Consequently, in the second repetition, the through electrodes 62b and the parts of the metal wiring 63b are equally spaced from each other as the second spacing D2 wider than the first spacing D1 as shown in FIG. 3B (b).

Next, in an external terminal electrode forming step shown in FIG. 3B (c), external terminal electrodes 50 connected to the metal wiring 63b are formed. The external terminal electrodes 50 are formed as copper is formed by solder or electroplating.

As described above, according to the semiconductor device according to the embodiment, the terminal electrode spacing of the semiconductor chip is made to correspond to general terminal spacing of C4 bump pitch, etc., whereby a related-art wiring board can be used and the mechanical strength for supporting the semiconductor chip and the heat conductivity for dissipating heat generated from the semiconductor chip can be enhanced.

In the semiconductor device 10 according to the embodiment, the three layers of the insulating layer 61, the through electrodes 62, and the metal wiring 63 are used to ensure the fan out function. However, the number of the layers and the length of the metal wiring are not limited to them if arbitrary terminal electrodes 40 can be connected to the external terminal electrodes 50 without crossing each other.

In the manufacturing method of the semiconductor device according to the embodiment, the through electrodes 62, 62a, and 62b are formed and the metal wiring 63, 63a, and 63b are formed, for example, according to the semiadditive process, but the through electrodes 62, 62a, and 62b and the metal wiring 63, 63a, and 63b may be formed in separate steps.

First Modified Example of First Embodiment

Next, a first modified example of the first embodiment of the invention will be discussed with reference to FIGS. 4 to 6.

To begin with, a semiconductor device according to the first modified example of the first embodiment of the invention will be discussed with reference to FIG. 4.

Figure 4:
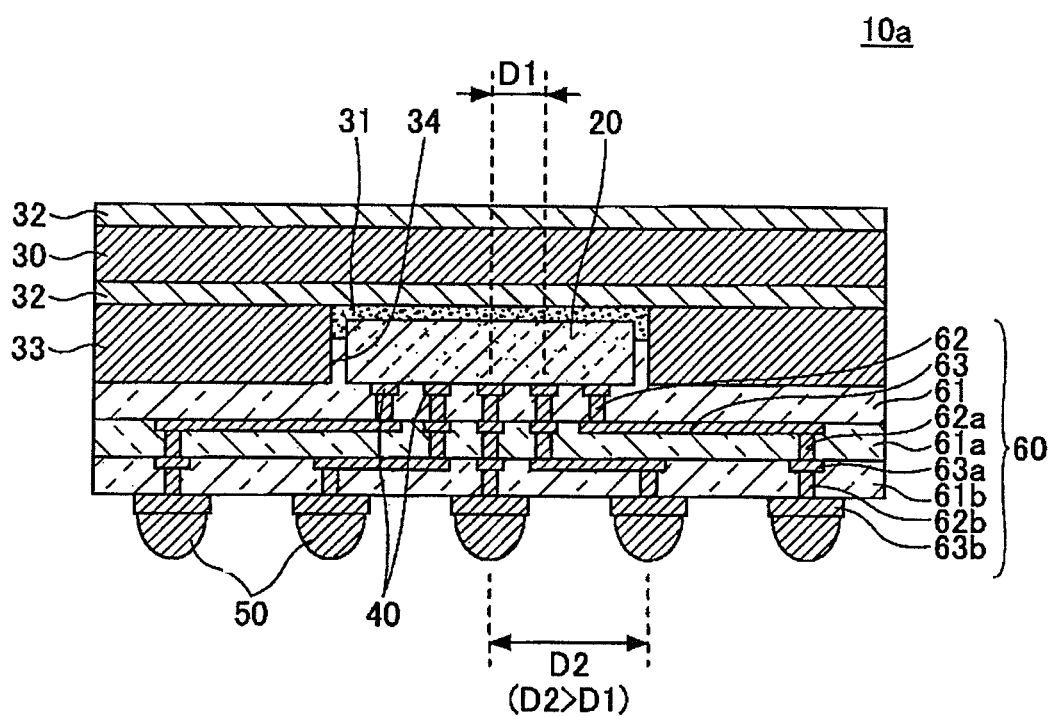
FIG. 4 is a sectional view to schematically show a semiconductor device according to a first modified example of the first embodiment of the invention.

FIG. 4 is a sectional view to schematically show the semiconductor device according to the first modified example. In the description to follow, parts previously described are denoted by the same reference numerals and may not be discussed again. (Similar comments apply to the following modified examples.)

The semiconductor device according to the first modified example differs from the semiconductor device according to the first embodiment in that a second metal film is provided on a support board through a first metal film and is formed with a fit hole into which a semiconductor chip is to be fitted.

Referring to FIG. 4, unlike the semiconductor device according to the first embodiment wherein the semiconductor chip is adhered to the support board with the adhesive and the side on which the terminal electrodes are provided is covered with the insulating film, a semiconductor device 10a according to the first modified example is characterized in that a second metal film 33 is provided on a support board 30 through a first metal film 32 and is formed with a fit hole 34 into which a semiconductor chip 20 is to be fitted and the semiconductor chip 20 is fitted into the fit hole 34 so that the side on which terminal electrodes 40 are provided is exposed, and is adhered to the fit hole 34 with an adhesive 31.

As shown in FIG. 4, the semiconductor device 10a according to the first modified example has the semiconductor chip 20, the support board 30, the terminal electrodes 40, external terminal electrodes 50, and a fan out section 60. The structures of the semiconductor chip 20, the terminal electrodes 40, and the external terminal electrodes 50 are the same as those of the semiconductor device 10 according to the first embodiment.

On the other hand, the support board 30 has both faces covered with the first metal film 32. The second metal film 33 is formed on one face of the support board 30 through the first metal film 32. The thickness of the second metal film 33 is almost the same as the height of the semiconductor chip 20. The second metal film 33 is removed as almost the same shape as the semiconductor chip 20 in a plan view to form the fit hole 34. The opposite side of the semiconductor chip 20 to the side on which the terminal electrodes 40 are provided is adhered to the fit hole 34 with the adhesive 31.

The first insulating layer 61 forming a part of the fan out section 60 in the first embodiment contains a portion having almost the same thickness as the height of the semiconductor chip 20; while, in the first modified example, a first insulating layer 61 has a thickness covering the terminal electrodes 40 of the semiconductor chip 20 in all portions except the gaps between the semiconductor chip 20 and the fit hole 34.

Next, a fan out function, a function of ensuring the mechanical strength, and a function of ensuring heat conductivity will be discussed. The fan out function is similar to that in the first embodiment. As for the mechanical strength and the heat conductivity, the semiconductor chip 20 is fitted into the fit hole 34, whereby the side faces of the semiconductor chip 20 are covered with the second metal film 33. Thus, the mechanical strength and the heat conductivity can be more enhanced as compared with the first embodiment.

Next, preferred material for forming the semiconductor device 10a will be discussed. The first insulating layer 61, through electrodes 62, the adhesive 31, metal wiring 63, and the external terminal electrodes 50 can use the same material as the material of the first embodiment.

Material of the support board 30 is not limited; however, for example, a nickel plate can be used. Material of the first metal film is not limited; however, for example, gold can be used. Material of the second metal film is not limited; however, for example, copper can be used.

First Manufacturing Method of Semiconductor Device According to First Modified Example of First Embodiment Next, a first manufacturing method of the semiconductor device according to the first modified example will be discussed with reference to FIGS. 5A to 5C.

Figure 5A:
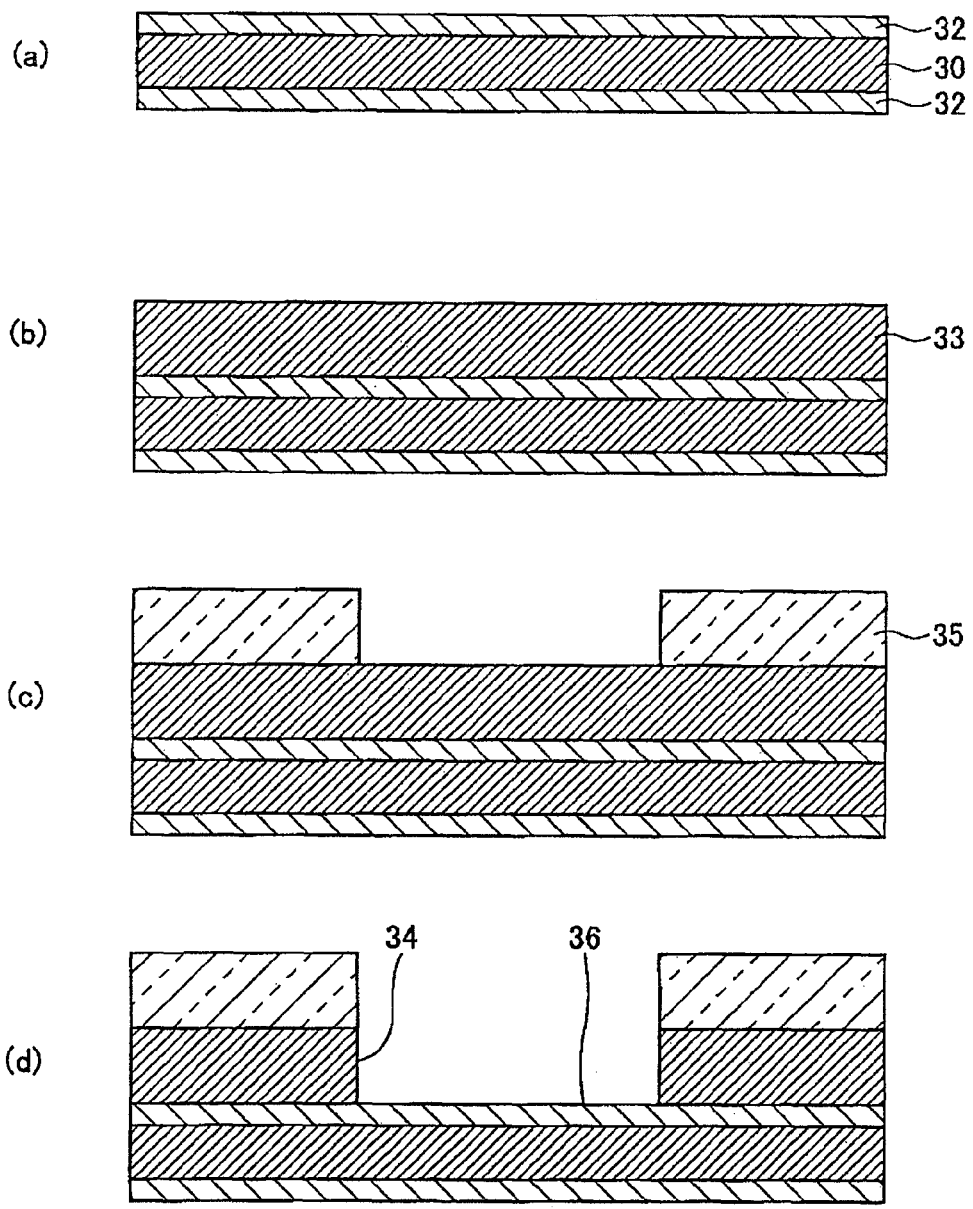
FIG. 5A is a drawing to schematically show a first manufacturing method of the semiconductor device according to the first modified example of the first embodiment of the invention (No. 1)
Figure 5B:
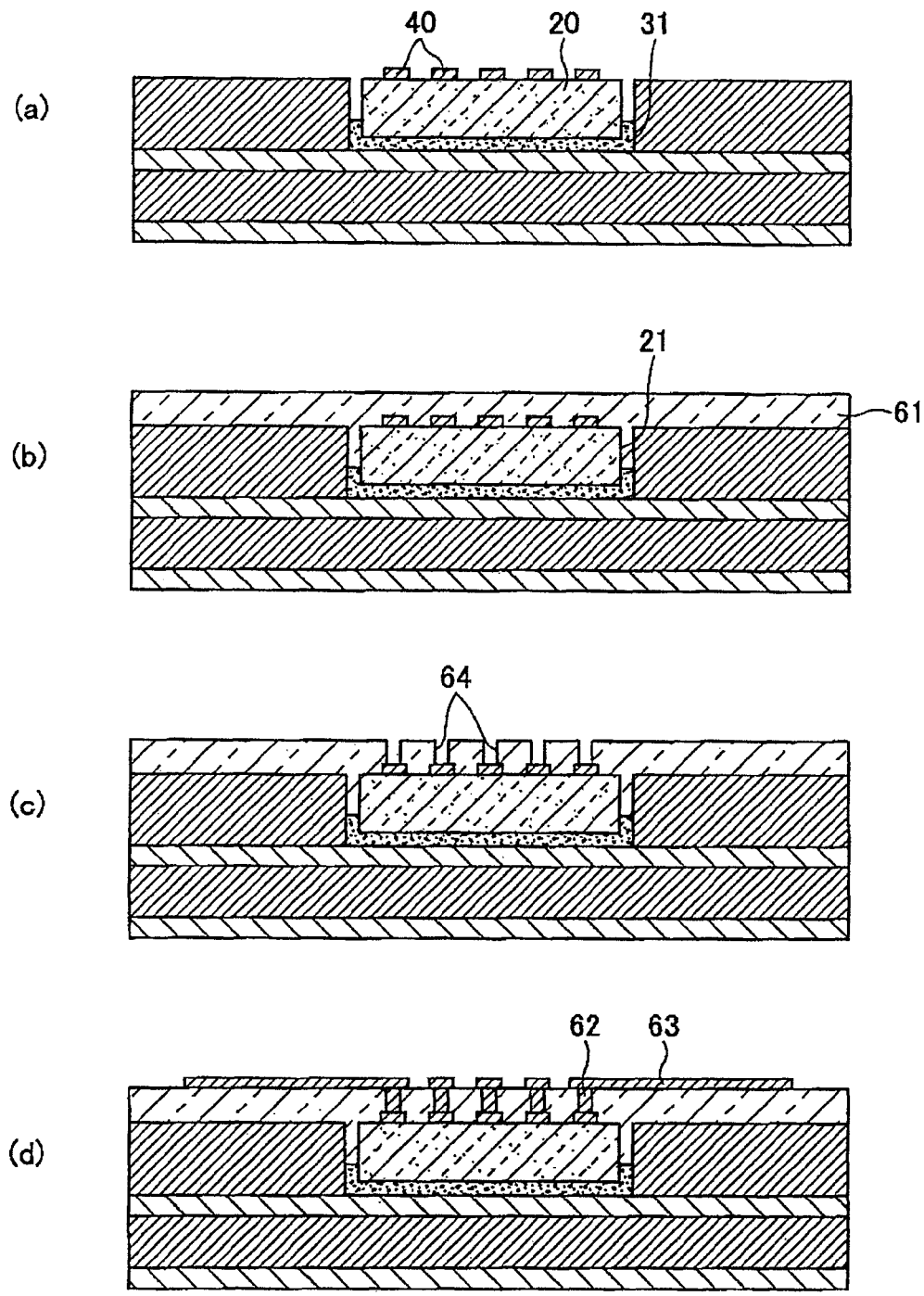
FIG. 5B is a drawing to schematically show the first manufacturing method of the semiconductor device according to the first modified example of the first embodiment of the invention (No. 2)
Figure 5C:
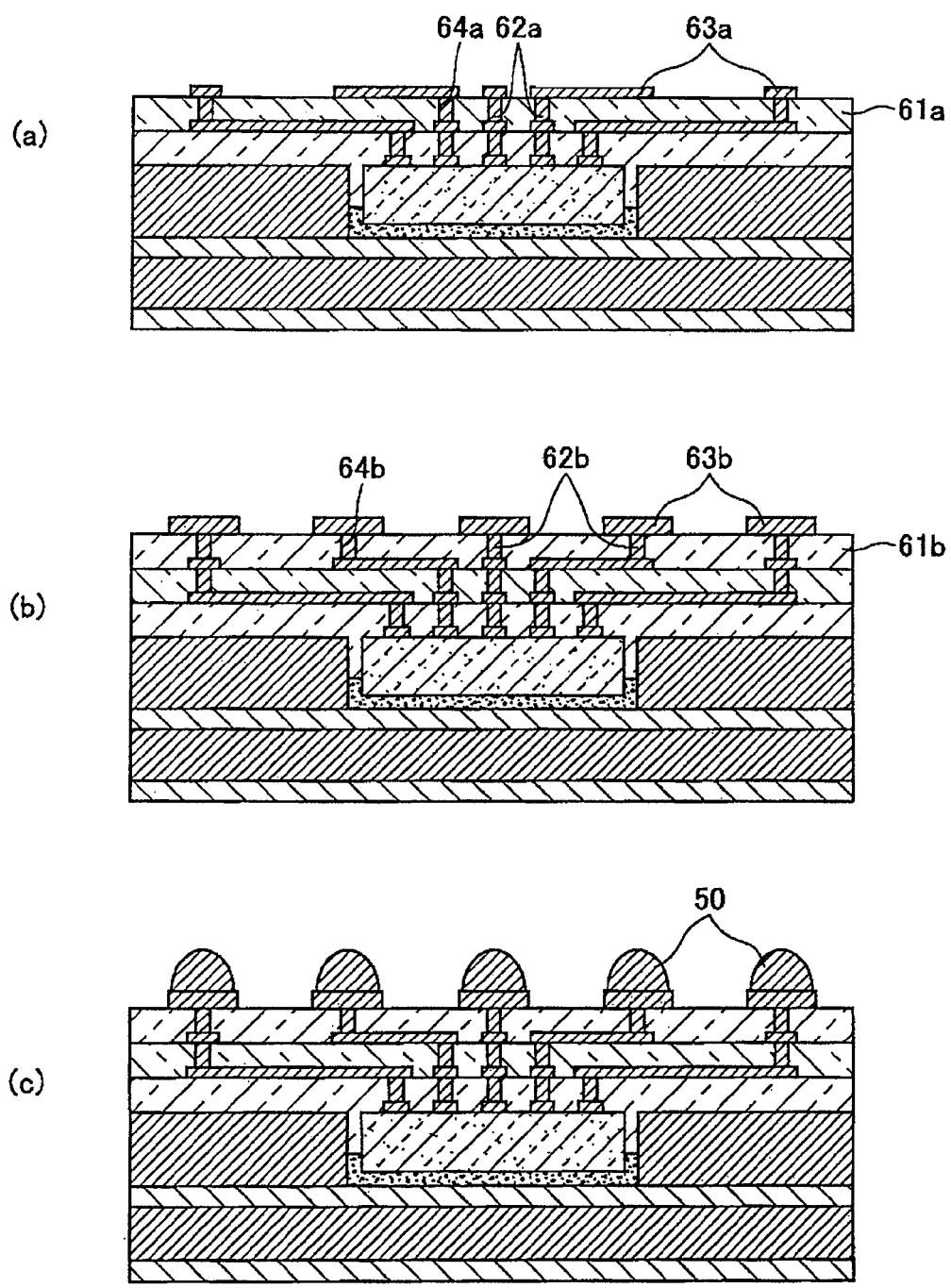
FIG. 5C is a drawing to schematically show the first manufacturing method of the semiconductor device according to the first modified example of the first embodiment of the invention (No. 3)

FIGS. 5A to 5C are drawings to schematically show the first manufacturing method of the semiconductor device according to the first modified example.

First, as shown in FIG. 5A (a), a support board 30 made of a nickel plate having a thickness of 100 to 1000 μm, for example, is provided. Both faces of the support board 30 made of a nickel plate are previously electroplated with gold to form a first metal film 32 made of gold having a thickness of 30 to 400 nm, for example.

Next, in a metal film forming step shown in FIG. 5A (b), the top of the first metal film 32 formed by gold plating on the support board 30 is electroplated with copper to form a second metal film 33 made of copper having a thickness of 100 to 800 μm, for example. The thickness of 100 to 800 μm is almost equal to the height of the semiconductor chip 20, 100 to 800 μm, for example.

Next, in a fit hole forming step shown in FIG. 5A (c), a resist pattern made of a dry film resist 35 is formed on the second metal film 33. That is, the dry film resist 35 having a thickness of 10 to 30 μm, for example, is deposited on the second metal film 33 and is exposed and is developed and the portion corresponding to the shape of the semiconductor chip 20 in the plan view is removed to form a resist pattern. The shape of this resist pattern corresponds to the shape of the fit hole 34 to fit the semiconductor chip 20, later formed in the second metal film 33.

Next, in the fit hole forming step shown in FIG. 5A (d), the fit hole 34 is formed by etching the second metal film 33 made of copper using cupric chloride as an etching liquid with the resist pattern made of the dry film resist 35 formed on the second metal film 33 as an etching protection film. At this time, the etching proceeds in the depth direction of the second metal film 33 made of copper. When the etching reaches the surface of the first metal film 32 formed by gold plating, the progress of the etching stops and thus the flatness of a mounting face 36 of the fit hole 34 to fit the semiconductor chip 20 on which the semiconductor chip 20 is to be mounted can be ensured. The depth of the fit hole 34 is equal to the thickness of the second metal film 33 and the thickness of the second metal film 33 is almost equal to the height of the semiconductor chip 20, 100 to 800 μm, for example, and therefore the depth of the fit hole 34 is almost equal to the height of the semiconductor chip 20.

Next, in the fit hole adhering step shown in FIG. 5B (a), the semiconductor chip 20 is fitted into the fit hole 34 and the semiconductor chip 20 is adhered to the fit hole 34 with an adhesive 31. Although a high heat conductive epoxy adhesive can also be used as the adhesive 31, the semiconductor chip 20 can also be adhered to the fit hole 34 by eutectic bonding using gold silicon because the mounting face 36 is formed of gold.

Next, in an insulating layer forming step shown in FIG. 5B (b), an insulating layer 61 made of an epoxy-based resin or a polyimide-based resin is formed. Specifically, the insulating layer 61 having a thickness of 5 to 30 μm, for example, is formed so as to cover the side provided with terminal electrodes 40 of the semiconductor chip 20 fitted into the fit hole 34 and the surface of the second metal film 33. As described above, the depth of the fit hole 34 is almost equal to the height of the semiconductor chip 20 and therefore the side provided with terminal electrodes 40 of the semiconductor chip 20 fitted into the fit hole 34 and the surface of the second metal film 33 almost equal in height. In addition, the insulating layer 61 also fills in the gaps between side faces 21 of the semiconductor chip 20 and the fit hole 34. Thus, the terminal electrodes 40 of the semiconductor chip 20 are covered with the insulating layer 61 for flatness.

Next, through holes 64 are formed, for example, using a laser (FIG. 5B (c)) and through electrodes 62 are formed and metal wiring 63 is formed, for example, according to the semiadditive process (FIG. 5B (d)). Further, the steps in FIG. 5B (b) to 5B (d) are repeated twice to form a fan out section 60 (FIGS. 5C (a) and 5C (b)) and external terminal electrodes 50 (FIG. 5C (c)). The steps shown in FIGS. 5B (c), 5B (d), and 5C (a) to 5C (c) are the same as those shown in FIGS. 3A (c), 3A (d), and 3B (a) to 3B (c) in the manufacturing method of the first embodiment. In the first repetition, the insulating layer 61a, the through holes 64a, the through electrodes 62a, and the metal wiring 63a are formed, and in the second repetition, the insulating layer 61b, the through holes 64b, the through electrodes 62b, and the metal wiring 63b are formed as in the first embodiment.

Second Manufacturing Method of Semiconductor Device According to First Modified Example of First Embodiment Next, a second manufacturing method of the semiconductor device according to the first modified example will be discussed with reference to FIGS. 5B to 6.

The manufacturing method differs from the first manufacturing method of the semiconductor device according to the first modified example in that a second metal film is formed with a fit hole using an additive process.

Figure 6:
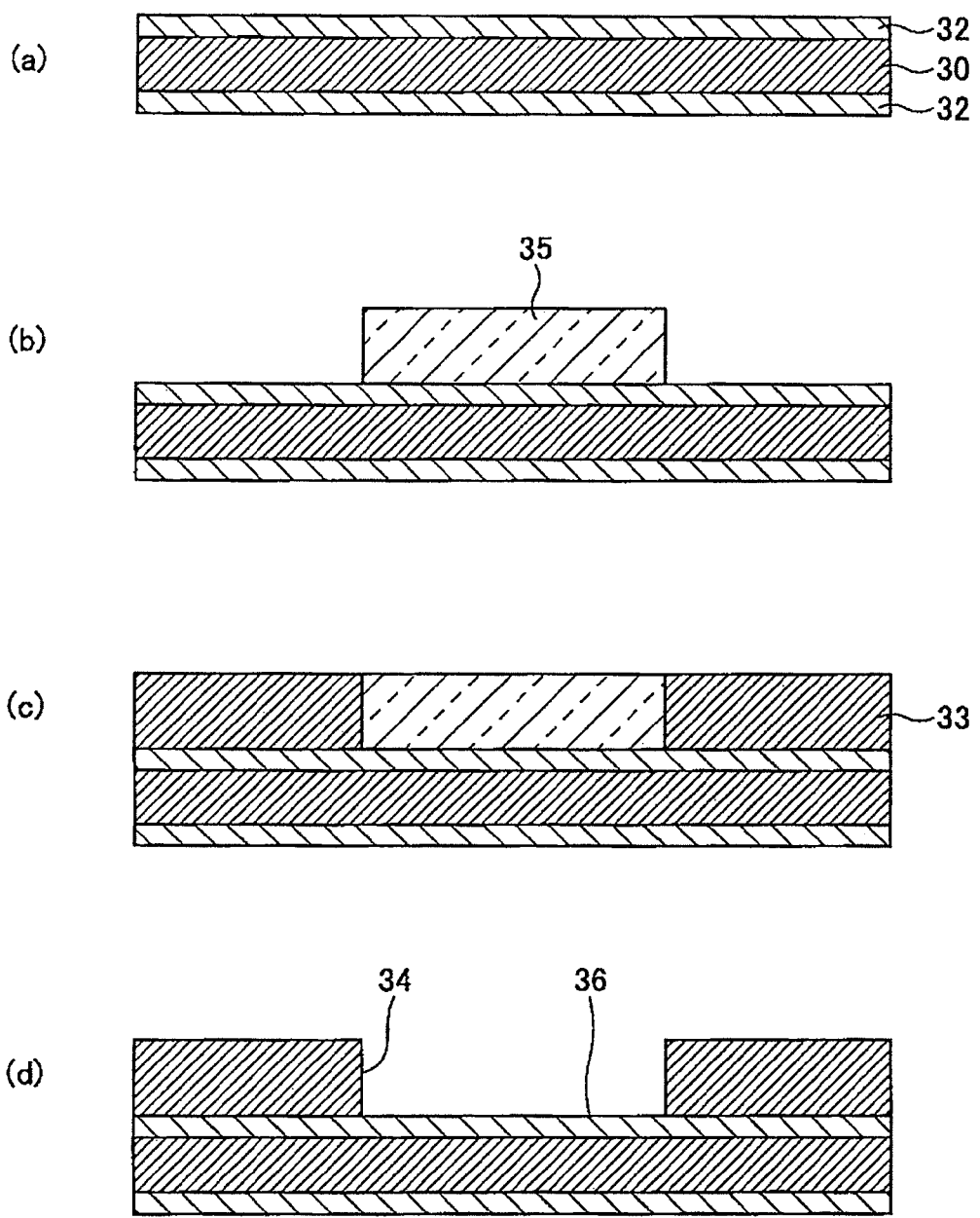
FIG. 6 is a drawing to schematically show a second manufacturing method of the semiconductor device according to the first modified example of the first embodiment of the invention.

Referring to FIG. 6, unlike the first manufacturing method of the semiconductor device according to the first modified example wherein the second metal film is formed on the support board and then the resist pattern corresponding to the fit hole is formed and the second metal film is etched to form the fit hole, the second manufacturing method is characterized in that after a first metal film is formed on a support board, before a second metal film is formed, a resist pattern corresponding to a fit hole is formed and then the second metal film is formed and the resist pattern is removed to form the fit hole in the second metal film.

FIG. 6 is a drawing to schematically show the second manufacturing method of the semiconductor device according to the first modified example. The manufacturing method will be discussed with FIGS. 6 (*a*) to 6 (*d*), 5B (a) to 5B (d), and 5C (a) to 5C (c).

First, as shown in FIG. 6 (*a*), a support board 30 made of a nickel plate having a thickness of 100 to 1000 μm, for example, is provided. Both faces of the support board 30 made of a nickel plate are previously electroplated with gold to form a first metal film 32 made of gold having a thickness of 30 to 400 nm, for example. This step is the same as the step shown in FIG. 5A (a) in the first manufacturing method of the semiconductor device according to the first modified example.

Next, in a step shown in FIG. 6 (*b*), a resist pattern made of a dry film resist 35 is formed on a first metal film 32. That is, a dry film resist 35 having a thickness of 10 to 30 μm, for example, is deposited on the first metal film 32 and is exposed and is developed and a resist pattern having a shape corresponding to the shape of a semiconductor chip 20 in the plan view is formed. The shape of this resist pattern corresponds to the shape of a fit hole 34 to fit the semiconductor chip 20, later formed in a second metal film 33. However, the shape of the resist pattern is a shape of a pattern inverted in positive and negative as compared with the first manufacturing method of the semiconductor device according to the first modified example.

Next, in a step shown in FIG. 6 (*c*), the top of the first metal film 32 formed with the resist pattern is electroplated with copper to form a second metal film 33 made of copper having a thickness of 100 to 800 μm, for example. The thickness of 100 to 800 μm is almost equal to the height of the semiconductor chip 20, 100 to 800 μm, for example.

Next, in a step shown in FIG. 6 (*d*), the full face of the dry film resist 35 left as the resist pattern is exposed and is developed and the dry film resist is peeled. Consequently, the second metal film 33 is formed with the fit hole 34 to fit the semiconductor chip 20. The depth of the fit hole 34 is equal to the thickness of the second metal film 33 and the thickness of the second metal film 33 is almost equal to the height of the semiconductor chip 20, 100 to 800 μm, for example, and therefore the depth of the fit hole 34 is almost equal to the height of the semiconductor chip 20.

After this, the steps of the step of fitting the semiconductor chip 20 into the fit hole 34 and adhering the semiconductor chip 20 to the fit hole 34 to the step of forming external terminal electrodes 50 are the same as the steps in FIGS. 5B (a) to 5B (d) and 5C (a) to 5C (c) in the first manufacturing method of the semiconductor device according to the first modified example.

As described above, according to the semiconductor device according to the first modified example, the terminal electrode spacing of the semiconductor chip can be made to correspond to general terminal spacing of C4 bump pitch, etc., and the semiconductor chip is fitted into the fit hole, whereby the mechanical strength and the heat conductivity can be more enhanced.

In the semiconductor device 10*a* according to the first modified example, the three layers of the insulating layer 61, the through electrodes 62, and the metal wiring 63 are used to ensure the fan out function. However, the number of the layers and the length of the metal wiring are not limited to them if arbitrary terminal electrodes 40 can be connected to the external terminal electrodes 50 without crossing each other.

In the manufacturing method of the semiconductor device according to the embodiment, the through electrodes 62, 62*a*, and 62*b* are formed and the metal wiring 63, 63*a*, and 63*b* are formed, for example, according to the semiadditive process, but the through electrodes 62, 62*a*, and 62*b* and the metal wiring 63, 63*a*, and 63*b* may be formed in separate steps.

Second Modified Example of First Embodiment

Next, a second modified example of the first embodiment of the invention will be discussed with reference to FIGS. 7 to 9.

To begin with, a semiconductor device according to the second modified example of the first embodiment of the invention will be discussed with reference to FIG. 7.

Figure 7:
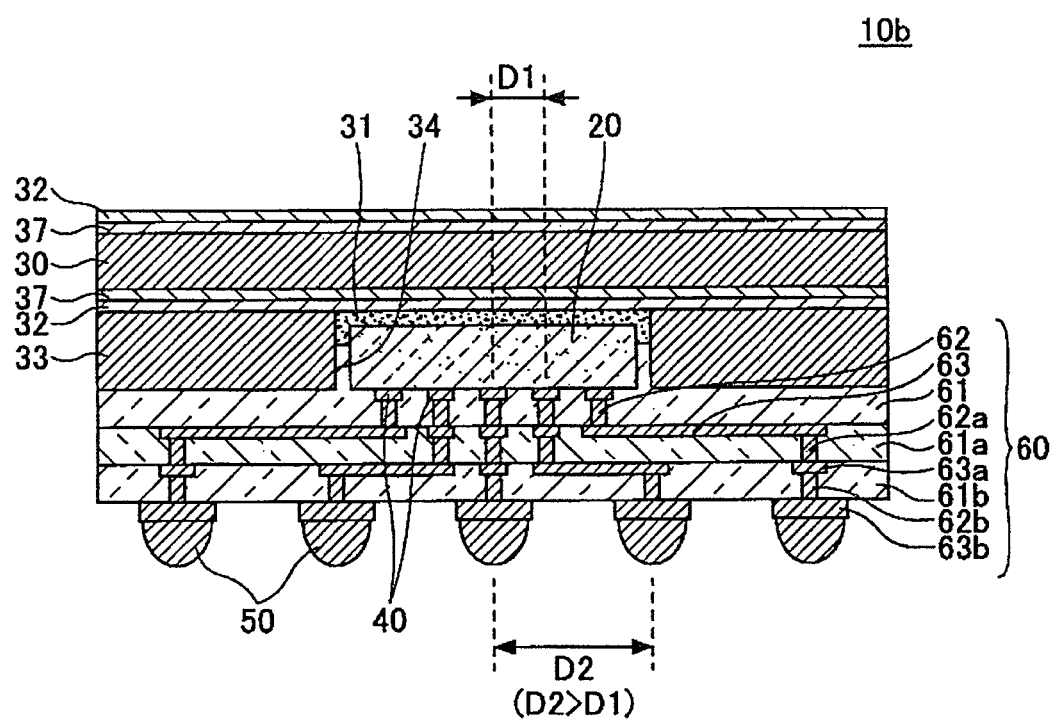
FIG. 7 is a sectional view to schematically show a semiconductor device according to a second modified example of the first embodiment of the invention.

FIG. 7 is a sectional view to schematically show the semiconductor device according to the second modified example.

The semiconductor device according to the second modified example differs from the semiconductor device according to the first modified example of the first embodiment in that a first metal film formed on a support board is provided through a support board surface treatment film.

Referring to FIG. 7, unlike the semiconductor device according to the first modified example of the first embodiment wherein the first metal film is formed directly on the support board, a semiconductor device 10*b* according to the second modified example is characterized in that a first metal film 32 is formed on a support board 30 through a support board surface treatment film 37.

As shown in FIG. 7, the semiconductor device 10*b* according to the second modified example has a semiconductor chip 20, the support board 30, terminal electrodes 40, external terminal electrodes 50, and a fan out section 60. The structures of the semiconductor chip 20, the terminal electrodes 40, the external terminal electrodes 50, and the fan out section 60 are the same as those of the semiconductor device 10*a* according to the first modified example of the first embodiment.

On the other hand, the support board 30 has both faces covered with the support board surface treatment film 37 and the surface of each of the support board surface treatment films 37 is covered with the first metal film 32. In one face of the support board 30A, a second metal film 33 is formed on the surface of the first metal film 32. The thickness of the second metal film 33 is almost equal to the height of the semiconductor chip 20 and a fit hole 34 is formed and the semiconductor chip 20 is fitted into the fit hole 34 and is adhered to the fit hole 34 as in the first modified example of the first embodiment.

The purpose of forming the first metal film 32 on the support board 30 through the support board surface treatment film 37 is to use any desired material combination as a combination of the support board 30 and the first metal film 32. That is, if it is difficult to form the first metal film 32 functioning as an etching stopper layer of the second metal film 33 directly on the support board 30, the first metal film 32 can be formed on the support board 30 through the support board surface treatment film 37.

Specifically, to use a copper plate, for example, as the support board 30 and to use gold of gold plating, for example, as the first metal film 32, if the top of the copper plate is directly plated with gold, gold and copper are diffused and gold plating cannot be executed. Therefore, the support board surface treatment film 37 made of nickel, for example, is provided on the surface of the support board 30 as a diffusion barrier. As other preferred materials, the same material as in the first modified example of the first embodiment can be used.

The semiconductor device has a fan out function, a function of ensuring the mechanical strength, and a function of ensuring heat conductivity similar to those of the semiconductor device of the first modified example of the first embodiment. Thus, particularly, the mechanical strength and the heat conductivity can be more enhanced as compared with the first embodiment.

First Manufacturing Method of Semiconductor Device According to Second Modified Example of First Embodiment Next, a first manufacturing method of the semiconductor device according to the second modified example will be discussed with reference to FIGS. 8A to 8C.

Figure 8A:
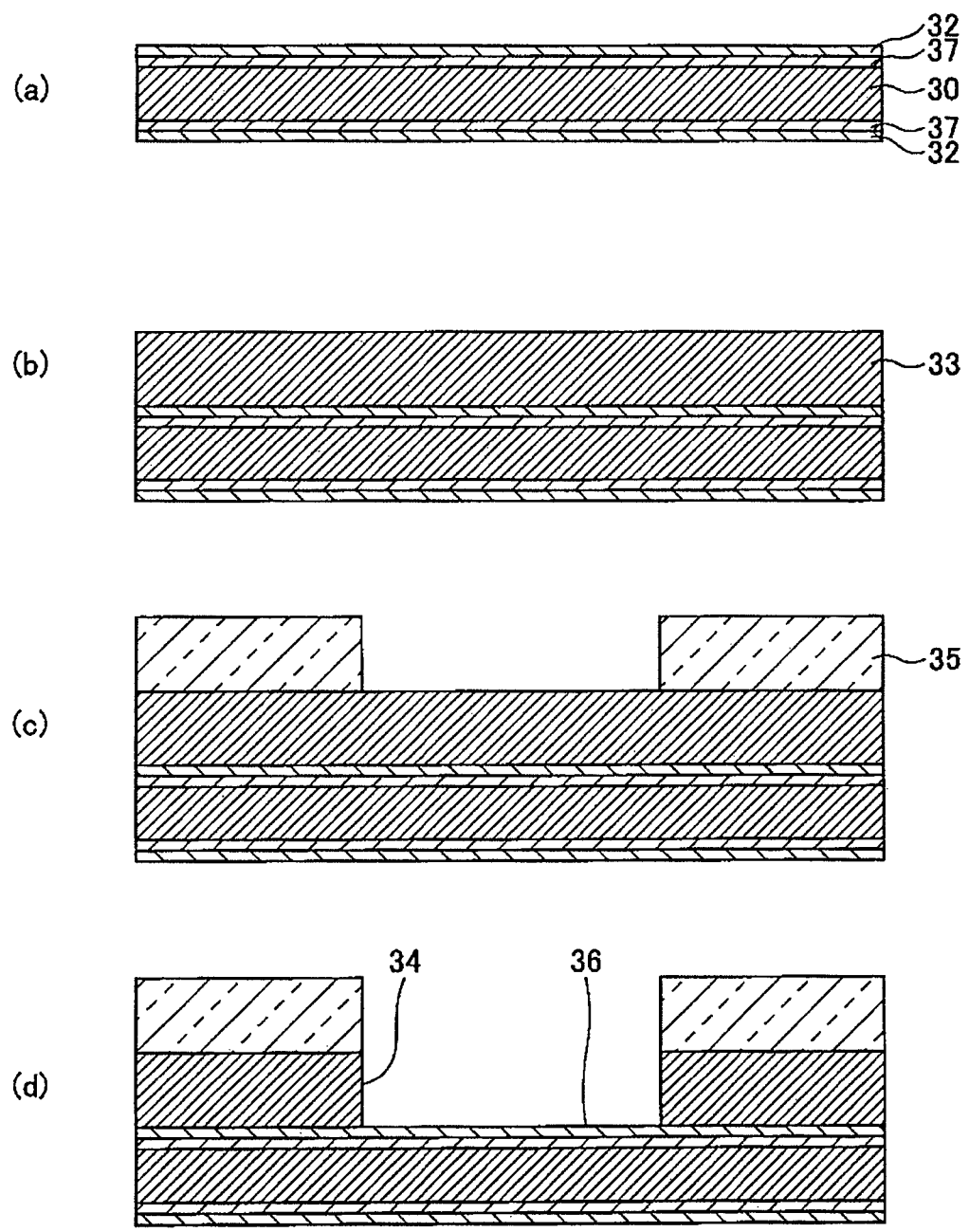
FIG. 8A is a drawing to schematically show a first manufacturing method of the semiconductor device according to the second modified example of the first embodiment of the invention (No. 1)
Figure 8B:
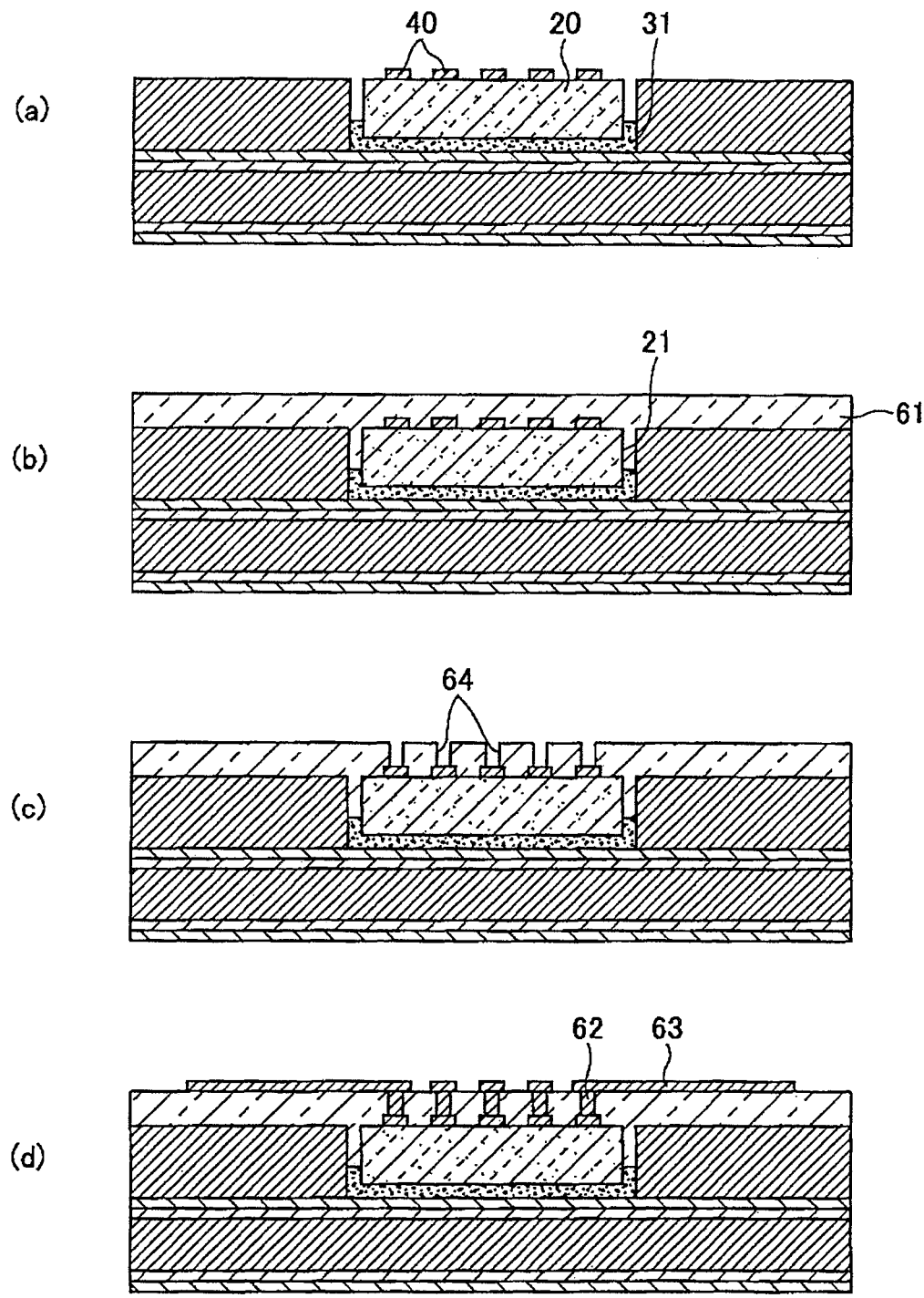
FIG. 8B is a drawing to schematically show the first manufacturing method of the semiconductor device according to the second modified example of the first embodiment of the invention (No. 2)
Figure 8C:
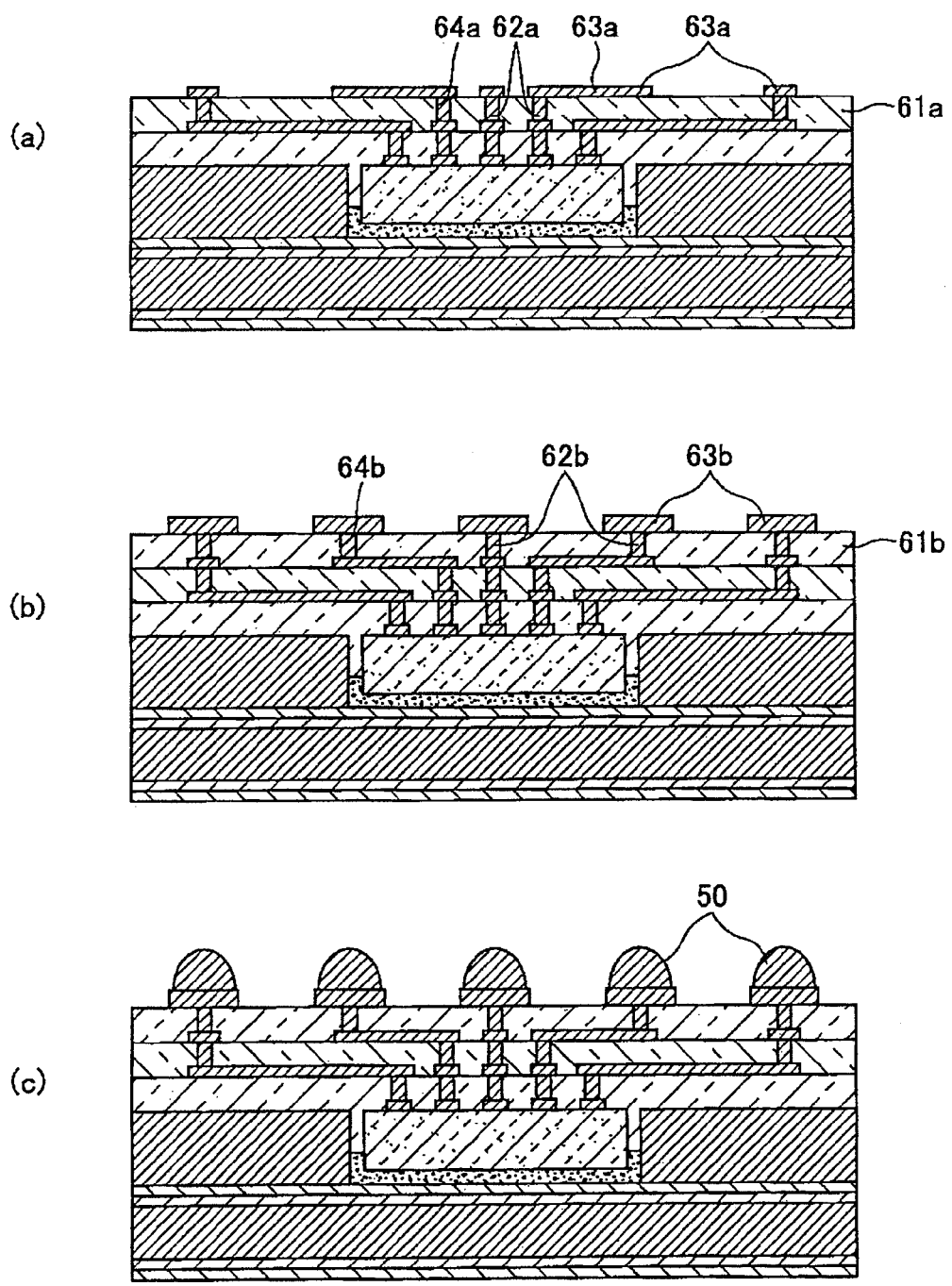
FIG. 8C is a drawing to schematically show the first manufacturing method of the semiconductor device according to the second modified example of the first embodiment of the invention (No. 3)

FIGS. 8A to 8C are drawings to schematically show the first manufacturing method of the semiconductor device according to the second modified example.

First, as shown in FIG. 8A (a), a support board 30 made of a copper plate having a thickness of 100 to 1000 μm, for example, is provided. Both faces of the support board 30 made of a copper plate are previously electroplated with nickel to form a support board surface treatment film 37 made of nickel having a thickness of 3 to 10 μm, for example. Next, electroplating with gold is performed to form a first metal film 32 made of gold having a thickness of 30 to 400 nm, for example.

Next, electroplating with copper is performed to form a second metal film 33 made of copper (FIG. 8A (b)), a resist pattern made of a dry film resist 35 is formed on the second metal film 33 (FIG. 8A (c)), a fit hole 34 is formed by etching the second metal film 33 made of copper to the surface of the first metal film 32 (FIG. 8A (d)), a semiconductor chip 20 is fitted into the fit hole 34 and is adhered to the fit hole 34 (FIG. 8B (a)), and an insulating layer 61 is formed so as to cover terminal electrodes 40 of the semiconductor chip 20 (FIG. 8B (b)). Further, through holes 64 are formed, for example, using a laser (FIG. 8B (c)) and through electrodes 62 are formed and metal wiring 63 is formed, for example, according to the semiadditive process (FIG. 8B (d)). The steps shown in FIGS. 8A (b) to 8A (d) and 8B (a) to 8B (d) are the same as those shown in FIGS. 5A (b) to 5A (d) and 5B (a) to 5B (d) in the manufacturing method of the first modified example of the first embodiment.

Next, the steps in FIG. 8B (b) to 8B (d) are repeated twice to form a fan out section 60 (FIGS. 8C (a) and 8C (b)) and external terminal electrodes 50 (FIG. 8C (c)). The steps shown in FIG. 8C (a) to 8C (c) are the same as those shown in FIG. 5C (a) to 5C (c) in the manufacturing method of the first modified example of the first embodiment. In the first repetition, the insulating layer 61a, the through holes 64a, the through electrodes 62a, and the metal wiring 63a are formed, and in the second repetition, the insulating layer 61b, the through holes 64b, the through electrodes 62b, and the metal wiring 63b are formed as in the first modified example of the first embodiment.

Second Manufacturing Method of Semiconductor Device According to Second Modified Example of First Embodiment Next, a second manufacturing method of the semiconductor device according to the second modified example will be discussed with reference to FIGS. 8B to 9.

The manufacturing method differs from the first manufacturing method of the semiconductor device according to the second modified example in that a second metal film is formed with a fit hole using an additive process.

Figure 9:
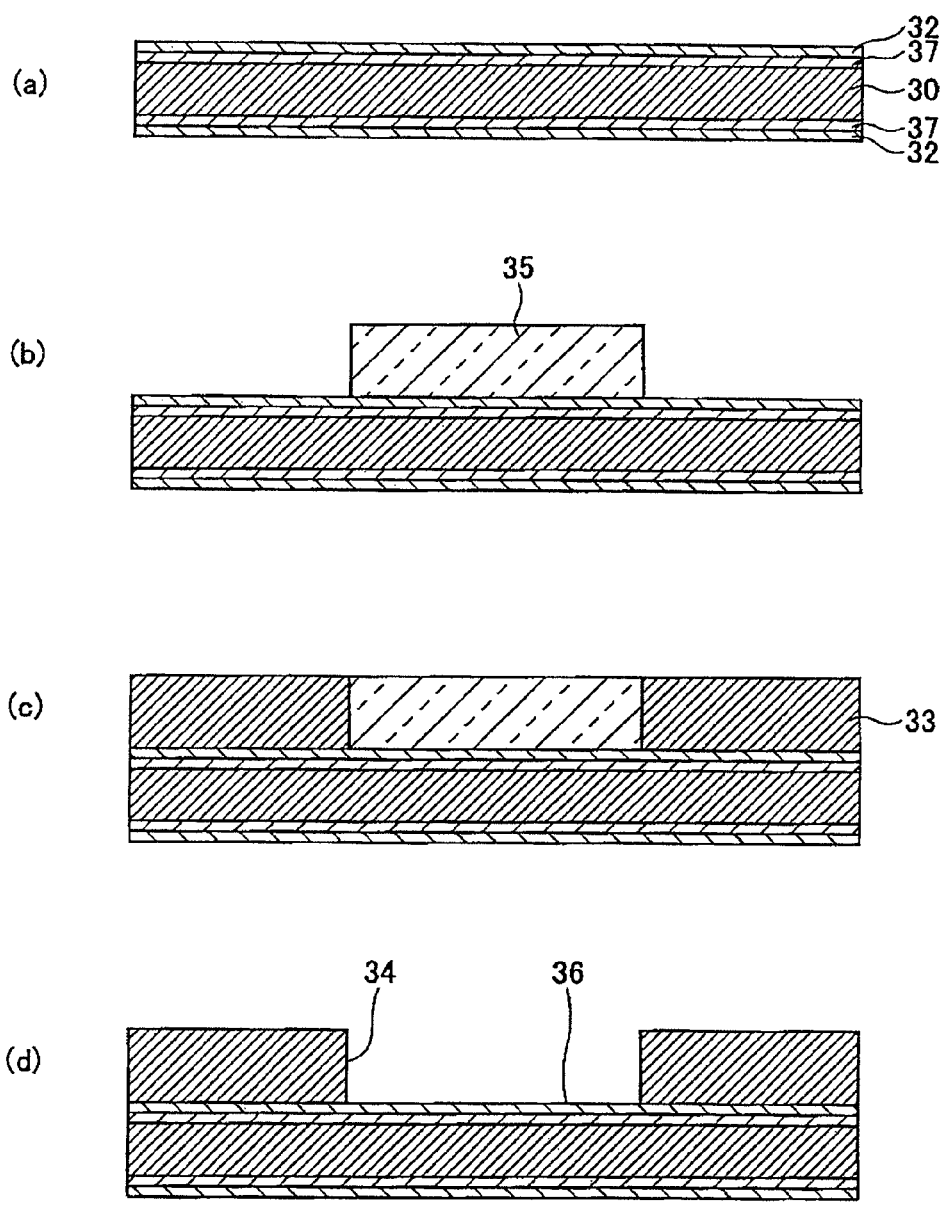
FIG. 9 is a drawing to schematically show a second manufacturing method of the semiconductor device according to the second modified example of the first embodiment of the invention.

Referring to FIG. 9, unlike the first manufacturing method of the semiconductor device according to the second modified example wherein the second metal film is formed on the support board and then the resist pattern corresponding to the fit hole is formed and the second metal film is etched to form the fit hole, the second manufacturing method is characterized in that after a first metal film is formed on a support board, before a second metal film is formed, a resist pattern corresponding to a fit hole is formed and then the second metal film is formed and the resist pattern is removed to form the fit hole in the second metal film.

FIG. 9 is a drawing to schematically show the second manufacturing method of the semiconductor device according to the second modified example. The manufacturing method will be discussed with FIGS. 9 (a) to 9 (d), 8B (a) to 8B (d), and 8C (a) to 8C (c).

First, as shown in FIG. 9 (a), a support board 30 made of a copper plate having a thickness of 100 to 1000 μm, for example, is provided. Both faces of the support board 30 made of a copper plate are previously electroplated with nickel to form a support board surface treatment film 37 made of nickel having a thickness of 3 to 10 μm, for example. Next, electroplating with gold is performed to form a first metal film 32 made of gold having a thickness of 30 to 400 nm, for example. This step is the same as the step shown in FIG. 8A (a) in the first manufacturing method of the semiconductor device according to the second modified example.

Next, in a step shown in FIG. 9 (b), a resist pattern made of a dry film resist 35 is formed on a first metal film 32. That is, a dry film resist 35 having a thickness of 10 to 30 μm, for example, is deposited on the first metal film 32 and is exposed and is developed and a resist pattern having a shape corresponding to the shape of a semiconductor chip 20 in the plan view is formed. The shape of this resist pattern corresponds to the shape of a fit hole 34 to fit the semiconductor chip 20, later formed in a second metal film 33. However, the shape of the resist pattern is a shape of a pattern inverted in positive and negative as compared with the first manufacturing method of the semiconductor device according to the second modified example.

Next, in a step shown in FIG. 9 (c), the top of the first metal film 32 formed with the resist pattern is electroplated with copper to form a second metal film 33 made of copper having a thickness of 100 to 800 μm, for example. The thickness of 100 to 800 μm is almost equal to the height of the semiconductor chip 20, 100 to 800 μm, for example.

Next, in a step shown in FIG. 9 (d), the full face of the dry film resist 35 left as the resist pattern is exposed and is developed and the dry film resist is peeled. Consequently, the second metal film 33 is formed with the fit hole 34 to fit the semiconductor chip 20. The depth of the fit hole 34 is equal to the thickness of the second metal film 33 and the thickness of the second metal film 33 is almost equal to the height of the semiconductor chip 20, 100 to 800 μm, for example, and therefore the depth of the fit hole 34 is almost equal to the height of the semiconductor chip 20.

After this, the steps of the step of fitting the semiconductor chip 20 into the fit hole 34 and adhering the semiconductor chip 20 to the fit hole 34 to the step of forming external terminal electrodes 50 are the same as the steps in FIGS. 8B (a) to 8B (d) and 8C (a) to 8C (c) in the first manufacturing method of the semiconductor device according to the second modified example.

As described above, according to the semiconductor device according to the second modified example, material in a wider range can be used for the support board and the first metal film, the terminal electrode spacing of the semiconductor chip can be made to correspond to general terminal spacing of C4 bump pitch, etc., and the semiconductor chip is fitted into the fit hole, whereby the mechanical strength and the heat conductivity can be more enhanced.

In the semiconductor device 10b according to the second modified example, the three layers of the insulating layer 61, the through electrodes 62, and the metal wiring 63 are used to ensure the fan out function. However, the number of the layers and the length of the metal wiring are not limited to them if arbitrary terminal electrodes 40 can be connected to the external terminal electrodes 50 without crossing each other.

In the manufacturing method of the semiconductor device according to the embodiment, the through electrodes 62, 62a, and 62b are formed and the metal wiring 63, 63a, and 63b are formed, for example, according to the semiadditive process, but the through electrodes 62, 62a, and 62b and the metal wiring 63, 63a, and 63b may be formed in separate steps.

Third Modified Example of First Embodiment

Next, a third modified example of the first embodiment of the invention will be discussed with reference to FIGS. 10 to 11C.

To begin with, a semiconductor device according to the third modified example of the first embodiment of the invention will be discussed with reference to FIG. 10.

Figure 10:
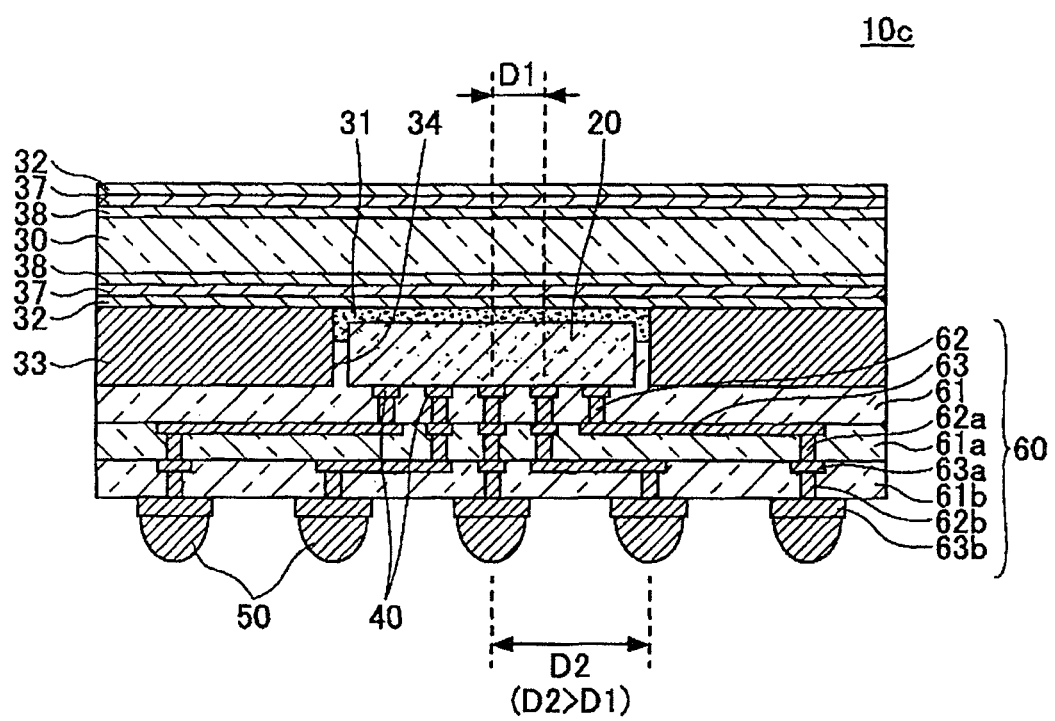
FIG. 10 is a sectional view to schematically show a semiconductor device according to a third modified example of the first embodiment of the invention.

FIG. 10 is a sectional view to schematically show the semiconductor device according to the third modified example.

The semiconductor device according to the third modified example differs from the semiconductor device according to the second modified example of the first embodiment in that a support board is a board with copper foil put on the surface of an insulator board.

Referring to FIG. 10, unlike the semiconductor device according to the second modified example of the first embodiment wherein the support board is a metal plate, a semiconductor device 10c according to the third modified example is characterized in that a support board 30 is a board with copper foil put on the surface of an insulator board.

As shown in FIG. 10, the semiconductor device 10c according to the third modified example has a semiconductor chip 20, the support board 30, terminal electrodes 40, external terminal electrodes 50, and a fan out section 60. The structures of the semiconductor chip 20, the terminal electrodes 40, the external terminal electrodes 50, and the fan out section 60 are the same as those of the semiconductor device 10b according to the second modified example of the first embodiment.

On the other hand, the support board 30 is an insulator board rather than a metal plate. The support board 30 has both faces on which copper foil 38 is put. In each face of the support board 30, the surface of the copper foil 38 is covered with a support board surface treatment film 37 and the top face of the support board surface treatment films 37 is covered with a first metal film 32. In one face of the support board 30, a second metal film 33 is formed on the first metal film 32. The thickness of the second metal film 33 is almost equal to the height of the semiconductor chip 20 and a fit hole 34 is formed and the semiconductor chip 20 is fitted into the fit hole 34 and is adhered to the fit hole 34 as in the second modified example of the first embodiment.

The support board 30 is an insulator board rather than a metal plate to use a general insulator board as a mount board. That is, even if a glass epoxy board, for example, is used as the support board 30, according to the third modified example, the semiconductor device 10c can be manufactured.

Specifically, a glass epoxy board, for example, can be used as the support board 30 and gold of gold plating, for example, can be used as the first metal film 32. The copper foil 38 is put on the surface of the support board 30 made of a glass epoxy board, whereby the support board surface treatment film 37 made of nickel, for example, can be provided on the copper foil 38 and gold of gold plating can be used as the first metal film 32 on the support board surface treatment films 37. The support board surface treatment film 37 made of nickel is provided for forming the first metal film 32 made of gold by plating with gold on the copper foil 38 as in the second modified example of the first embodiment.

The semiconductor device has a fan out function, a function of ensuring the mechanical strength, and a function of ensuring heat conductivity similar to those of the semiconductor device of the second modified example of the first embodiment. Thus, particularly, the mechanical strength and the heat conductivity can be more enhanced as compared with the first embodiment.

First Manufacturing Method of Semiconductor Device According to Third Modified Example of First Embodiment Next, a first manufacturing method of the semiconductor device according to the third modified example will be discussed with reference to FIGS. 11A to 11C.

Figure 11A:
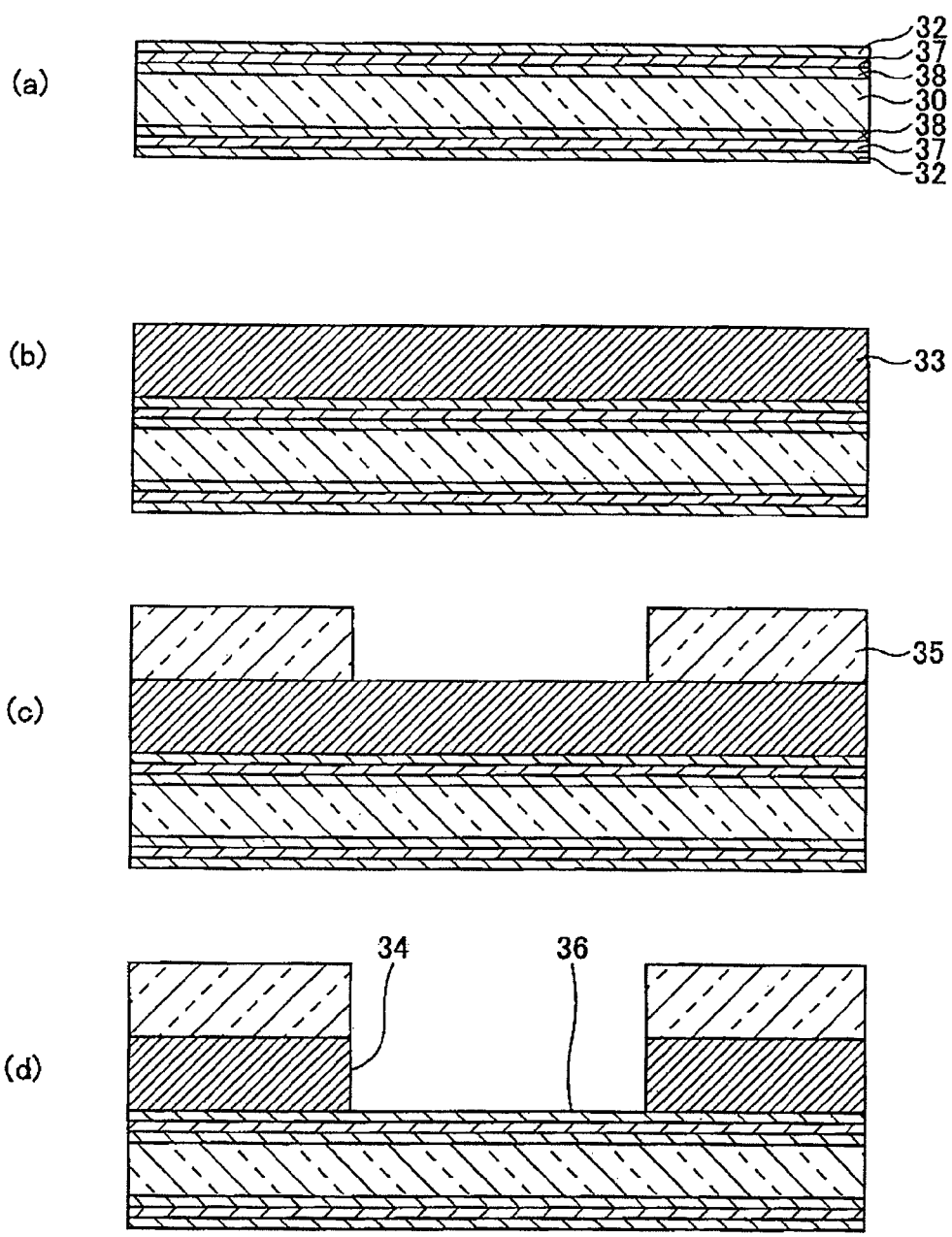
FIG. 11A is a drawing to schematically show a first manufacturing method of the semiconductor device according to the third modified example of the first embodiment of the invention (No. 1)
Figure 11B:
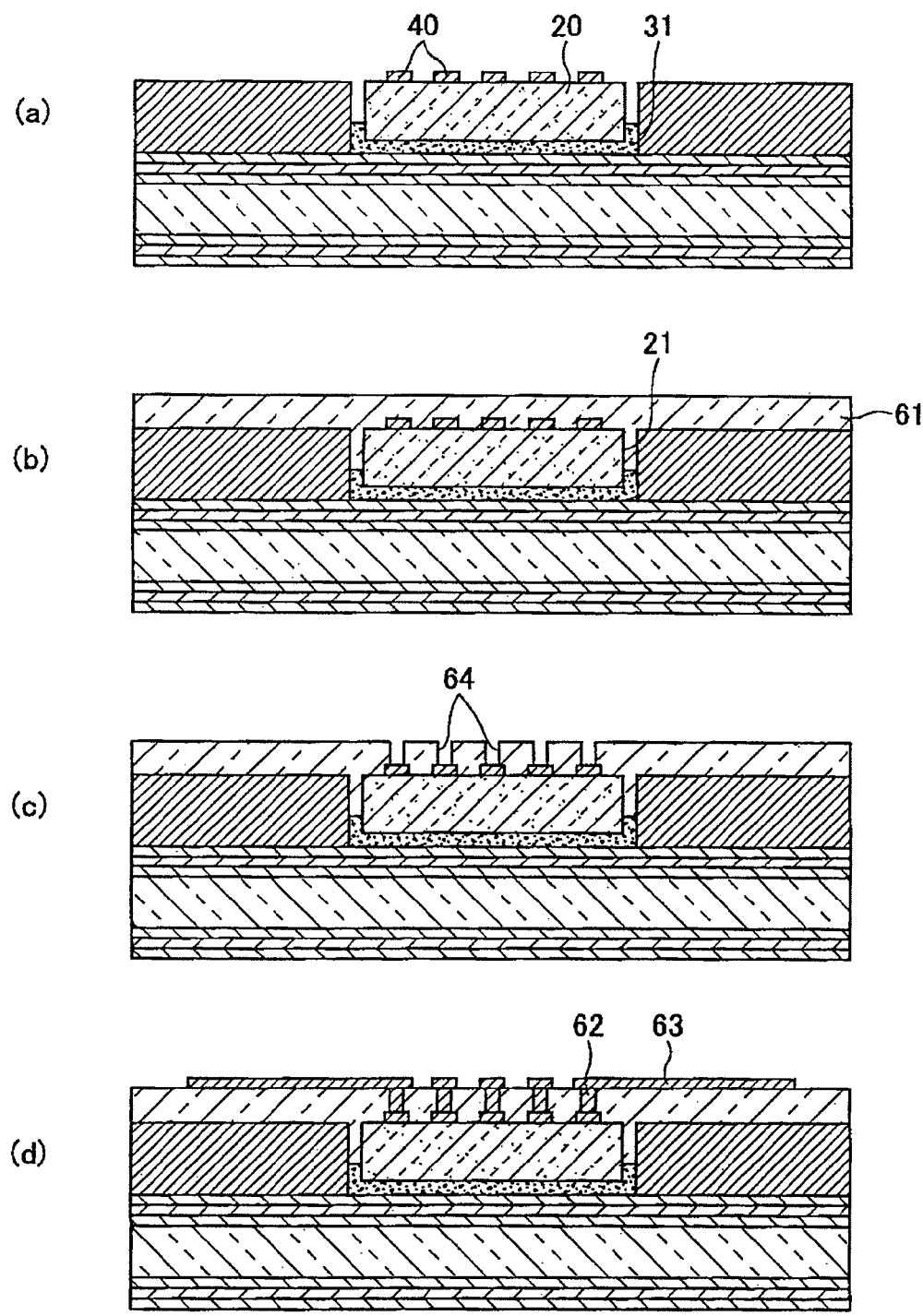
FIG. 11B is a drawing to schematically show the first manufacturing method of the semiconductor device according to the third modified example of the first embodiment of the invention (No. 2)
Figure 11C:
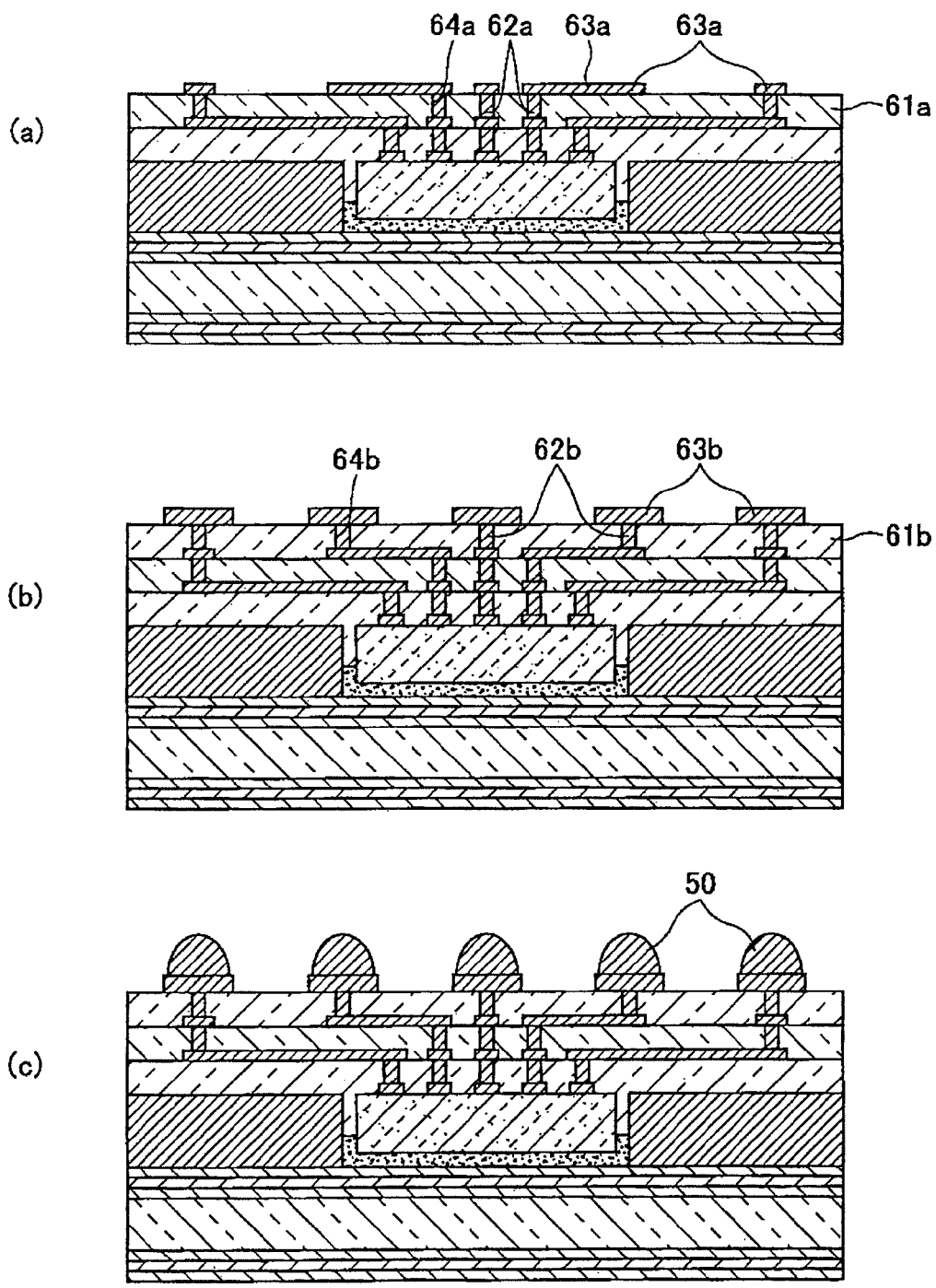
FIG. 11C is a drawing to schematically show the first manufacturing method of the semiconductor device according to the third modified example of the first embodiment of the invention (No. 3)

FIGS. 11A to 11C are drawings to schematically show the first manufacturing method of the semiconductor device according to the third modified example.

First, as shown in FIG. 11A (a), a support board 30 made of a glass epoxy board having a thickness of 100 to 1000 μm, for example, is provided. Copper foil 38 having a thickness of 10 to 100 μm, for example, is previously put on both faces of the support board 30 made of a glass epoxy board and further in both faces of the support board 30, the surface of the copper foil 38 is electroplated with nickel to form a support board surface treatment film 37 made of nickel having a thickness of 3 to 10 μm, for example. Next, in both faces of the support board 30, the surface of the support board surface treatment film 37 is electroplated with gold to form a first metal film 32 made of gold having a thickness of 30 to 400 nm, for example.

Next, electroplating with copper is performed to form a second metal film 33 made of copper (FIG. 11A (b)), a resist pattern made of a dry film resist 35 is formed on the second metal film 33 (FIG. 11A (c)), a fit hole 34 is formed by etching the second metal film 33 made of copper to the surface of the first metal film 32 (FIG. 11A (d)), a semiconductor chip 20 is fitted into the fit hole 34 and is adhered to the fit hole 34 (FIG. 11B (a)), and an insulating layer 61 is formed so as to cover terminal electrodes 40 of the semiconductor chip 20 (FIG. 11B (b)). Further, through holes 64 are formed, for example, using a laser (FIG. 11B (c)) and through electrodes 62 are formed and metal wiring 63 is formed, for example, according to the semiadditive process (FIG. 11B (d)). The steps shown in FIGS. 11A (b) to 11A (d) and 11B (a) to 11B (d) are the same as those shown in FIGS. 5A (b) to 5A (d) and 5B (a) to 5B (d) in the manufacturing method of the first modified example of the first embodiment.

Next, the steps in FIG. 11B (b) to 11B (d) are repeated twice to form a fan out section 60 (FIGS. 11C (a) and 11C (b)) and external terminal electrodes 50 (FIG. 11C (c)). The steps shown in FIG. 11C (a) to 11C (c) are the same as those shown in FIG. 5C (a) to 5C (c) in the manufacturing method of the first modified example of the first embodiment. In the first repetition, the insulating layer 61a, the through holes 64a, the through electrodes 62a, and the metal wiring 63a are formed, and in the second repetition, the insulating layer 61b, the through holes 64b, the through electrodes 62b, and the metal wiring 63b are formed as in the first modified example of the first embodiment.

Second Manufacturing Method of Semiconductor Device According to Third Modified Example of First Embodiment Next, a second manufacturing method of the semiconductor device according to the third modified example will be discussed with reference to FIGS. 11B to 12.

The manufacturing method differs from the first manufacturing method of the semiconductor device according to the third modified example in that a second metal film is formed with a fit hole using an additive process.

Figure 12:
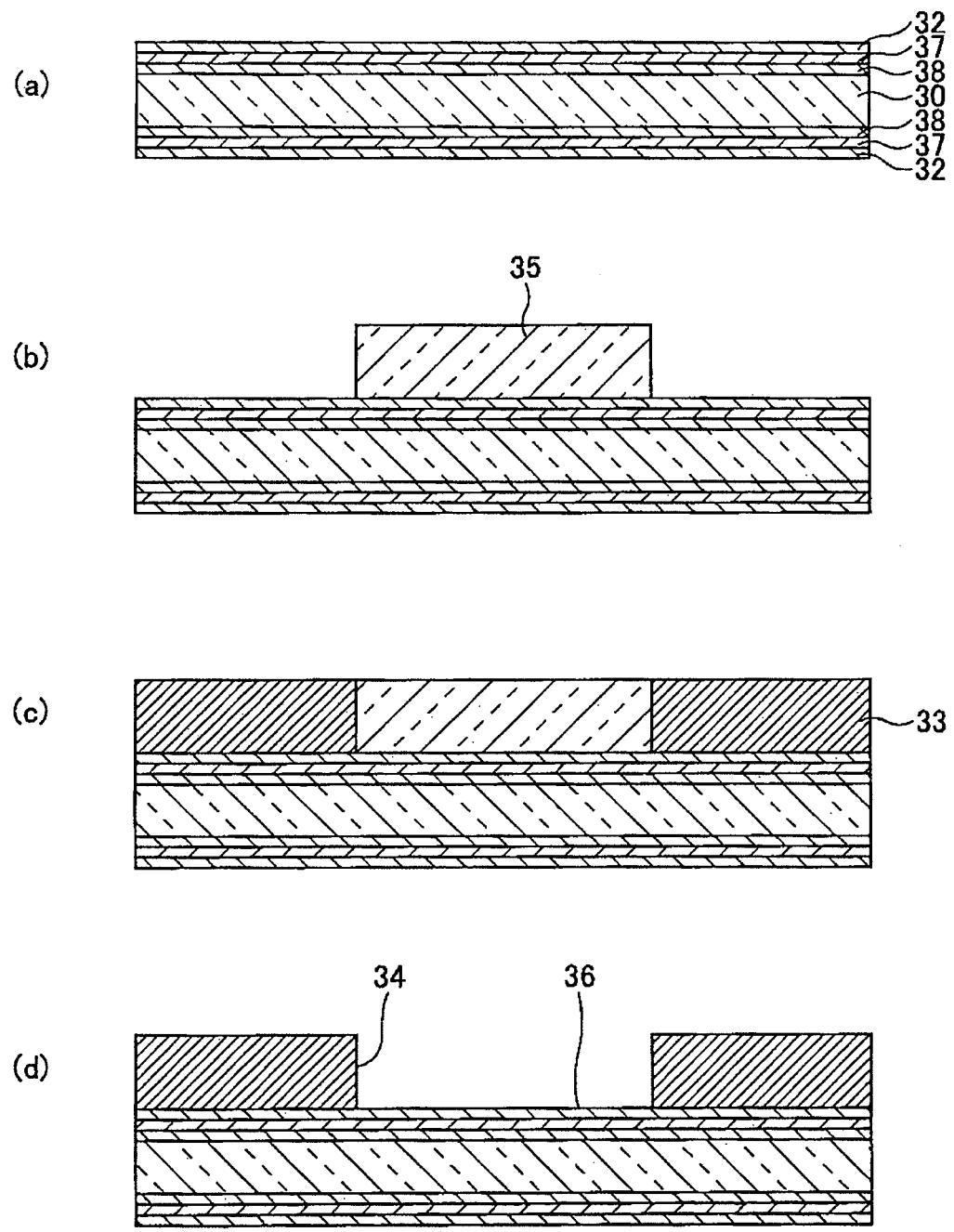
FIG. 12 is a drawing to schematically show a second manufacturing method of the semiconductor device according to the third modified example of the first embodiment of the invention.

Referring to FIG. 12, unlike the first manufacturing method of the semiconductor device according to the third modified example wherein the second metal film is formed on the support board and then the resist pattern corresponding to the fit hole is formed and the second metal film is etched to form the fit hole, the second manufacturing method is characterized in that after a first metal film is formed on a support board, before a second metal film is formed, a resist pattern corresponding to a fit hole is formed and then the second metal film is formed and the resist pattern is removed to form the fit hole in the second metal film.

FIG. 12 is a drawing to schematically show the second manufacturing method of the semiconductor device according to the third modified example. The manufacturing method will be discussed with FIGS. 12 (a) to 12 (d), 11B (a) to 11B (d), and 11C (a) to 11C (c).

First, as shown in FIG. 12 (a), a support board 30 made of a glass epoxy board having a thickness of 100 to 1000 μm, for example, is provided. Copper foil 38 having a thickness of 10 to 100 μm, for example, is previously put on both faces of the support board 30 made of a glass epoxy board and further in both faces of the support board 30, the surface of the copper foil 38 is electroplated with nickel to form a support board surface treatment film 37 made of nickel having a thickness of 3 to 10 μm, for example. Next, in both faces of the support board 30, the surface of the support board surface treatment film 37 is electroplated with gold to form a first metal film 32 made of gold having a thickness of 30 to 400 nm, for example. This step is the same as the step shown in FIG. 11A (a) in the first manufacturing method of the semiconductor device according to the third modified example.

Next, in a step shown in FIG. 12 (b), a resist pattern made of a dry film resist 35 is formed on a first metal film 32. That is, a dry film resist 35 having a thickness of 10 to 30 μm, for example, is deposited on the first metal film 32 and is exposed and is developed and a resist pattern having a shape corresponding to the shape of a semiconductor chip 20 in the plan view is formed. The shape of this resist pattern corresponds to the shape of a fit hole 34 to fit the semiconductor chip 20, later formed in a second metal film 33. However, the shape of the resist pattern is a shape of a pattern inverted in positive and negative as compared with the first manufacturing method of the semiconductor device according to the third modified example.

Next, in a step shown in FIG. 12 (c), the top of the first metal film 32 formed with the resist pattern is electroplated with copper to form a second metal film 33 made of copper having a thickness of 100 to 800 μm, for example. The thickness of 100 to 800 μm is almost equal to the height of the semiconductor chip 20, 100 to 800 μm, for example.

Next, in a step shown in FIG. 12 (d), the full face of the dry film resist 35 left as the resist pattern is exposed and is developed and the dry film resist is peeled. Consequently, the second metal film 33 is formed with the fit hole 34 to fit the semiconductor chip 20. The depth of the fit hole 34 is equal to the thickness of the second metal film 33 and the thickness of the second metal film 33 is almost equal to the height of the semiconductor chip 20, 100 to 800 μm, for example, and therefore the depth of the fit hole 34 is almost equal to the height of the semiconductor chip 20.

After this, the steps of the step of fitting the semiconductor chip 20 into the fit hole 34 and adhering the semiconductor chip 20 to the fit hole 34 to the step of forming external terminal electrodes 50 are the same as the steps in FIGS. 11B (a) to 11B (d) and 11C (a) to 11C (c) in the first manufacturing method of the semiconductor device according to the third modified example.

As described above, according to the semiconductor device according to the third modified example, material in a wider range can be used for the support board, the terminal electrode spacing of the semiconductor chip can be made to correspond to general terminal spacing of C4 bump pitch, etc., and the semiconductor chip is fitted into the fit hole, whereby the mechanical strength and the heat conductivity can be more enhanced.

In the semiconductor device 10c according to the third modified example, the three layers of the insulating layer 61, the through electrodes 62, and the metal wiring 63 are used to ensure the fan out function. However, the number of the layers and the length of the metal wiring are not limited to them if arbitrary terminal electrodes 40 can be connected to the external terminal electrodes 50 without crossing each other.

In the manufacturing method of the semiconductor device according to the embodiment, the through electrodes 62, 62a, and 62b are formed and the metal wiring 63, 63a, and 63b are formed, for example, according to the semiadditive process, but the through electrodes 62, 62a, and 62b and the metal wiring 63, 63a, and 63b may be formed in separate steps.

Fourth Modified Example of First Embodiment

Next, a fourth modified example of the first embodiment of the invention will be discussed with reference to FIGS. 13 and 14.

To begin with, a semiconductor device according to the fourth modified example of the first embodiment of the invention will be discussed with reference to FIG. 13.

Figure 13:
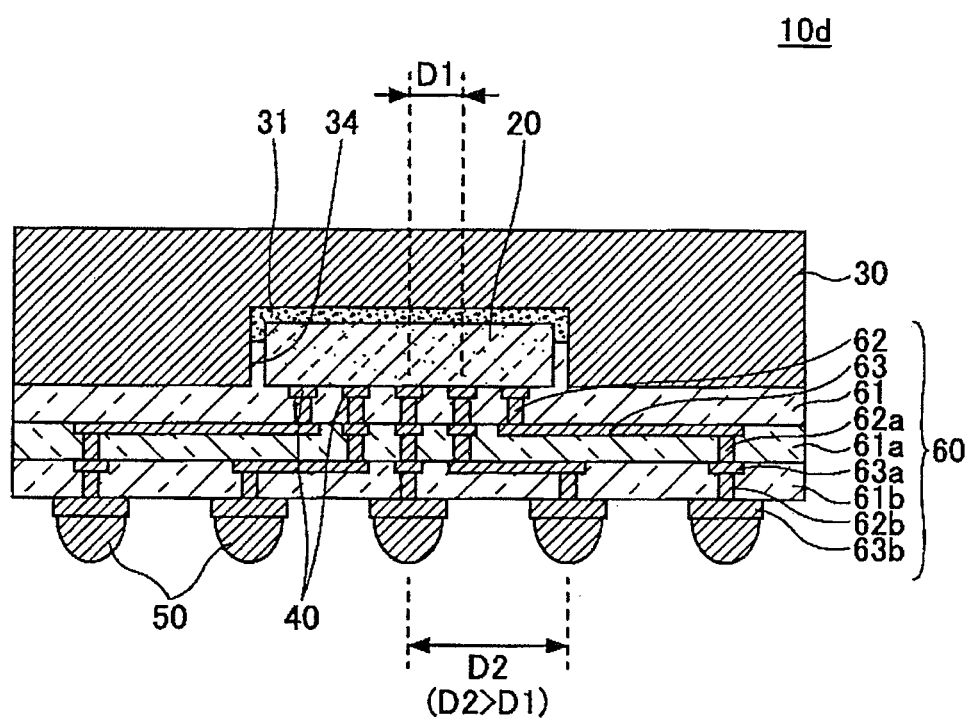
FIG. 13 is a sectional view to schematically show a semiconductor device according to a fourth modified example of the first embodiment of the invention.

FIG. 13 is a sectional view to schematically show the semiconductor device according to the fourth modified example.

The semiconductor device according to the fourth modified example differs from the semiconductor device according to the first embodiment in that an integral support board is formed with a fit hole into which a semiconductor chip is to be fitted.

Referring to FIG. 13, unlike the semiconductor device according to the first embodiment wherein the semiconductor chip is adhered to the support board with the adhesive and the side on which the terminal electrodes are provided is covered with the insulating film, a semiconductor device 10d according to the fourth modified example is characterized in that a support board 30 is formed with a fit hole 34 into which a semiconductor chip 20 is to be fitted, and the semiconductor chip 20 is fitted into the fit hole 34 so that the side on which terminal electrodes 40 are provided is exposed, and is adhered to the fit hole 34 with an adhesive 31.

As shown in FIG. 13, the semiconductor device 10d according to the fourth modified example has the semiconductor chip 20, the support board 30, the terminal electrodes 40, external terminal electrodes 50, and a fan out section 60. The structures of the semiconductor chip 20, the terminal electrodes 40, and the external terminal electrodes 50 are the same as those of the semiconductor device 10 according to the first embodiment.

On the other hand, the support board 30 is an integral support board and a portion of the support board 30 having almost the same shape as the semiconductor chip 20 in a plan view and corresponding to almost the same depth as the semiconductor chip 20 is removed to form the fit hole 34. The opposite side of the semiconductor chip 20 to the side on which the terminal electrodes 40 are provided is adhered to the fit hole 34 with the adhesive 31.

In the fan out section 60, the first insulating layer 61 has a portion of almost the same thickness as the semiconductor chip 20 in the plan view to also cover the side faces of the semiconductor chip 20 in the semiconductor device 10 according to the first embodiment; while, in the fourth modified example, a first insulating layer 61 has a thickness almost uniform in all portion because of a structure covering the side provided with the terminal electrodes 40 of the semiconductor chip 20 fitted into the fit hole 34 and the support board 30.

Next, a fan out function, a function of ensuring the mechanical strength, and a function of ensuring heat conductivity will be discussed. The fan out function is similar to that in the first embodiment. As for the mechanical strength and the heat conductivity, the semiconductor chip 20 is fitted into the fit hole 34, whereby the side faces of the semiconductor chip 20 are covered with the support board 30. Thus, the mechanical strength and the heat conductivity can be more enhanced as compared with the first embodiment.

Next, preferred material for forming the semiconductor device 10d will be discussed. The first insulating layer 61, through electrodes 62, the adhesive 31, metal wiring 63, and the external terminal electrodes 50 can use the same material as the material of the first embodiment.

Material of the support board 30 is not limited if it is a board excellent in the mechanical strength and the heat conductivity; a copper plate can be used.

Manufacturing Method of Semiconductor Device According to Fourth Modified Example of First Embodiment Next, a manufacturing method of the semiconductor device according to the fourth modified example will be discussed with reference to FIGS. 14A to 14C.

Figure 14A:
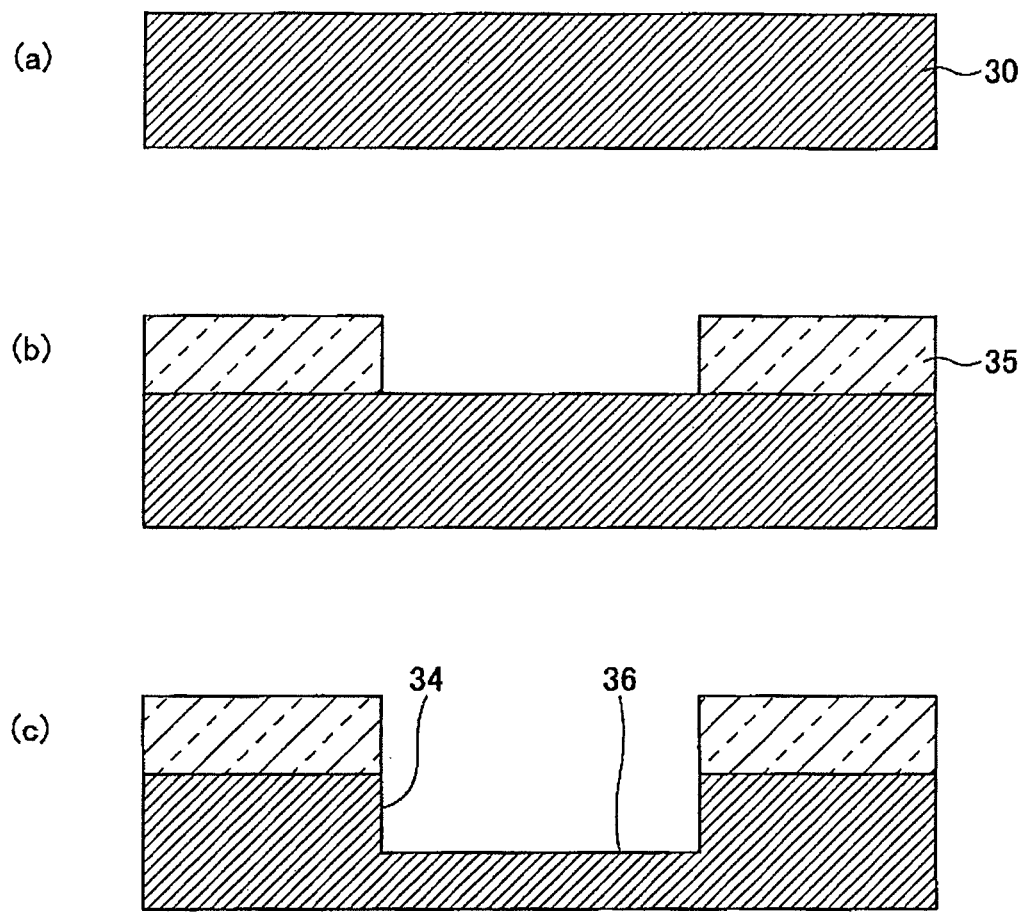
FIG. 14A is a drawing to schematically show a first manufacturing method of the semiconductor device according to the fourth modified example of the first embodiment of the invention (No. 1)
Figure 14B:
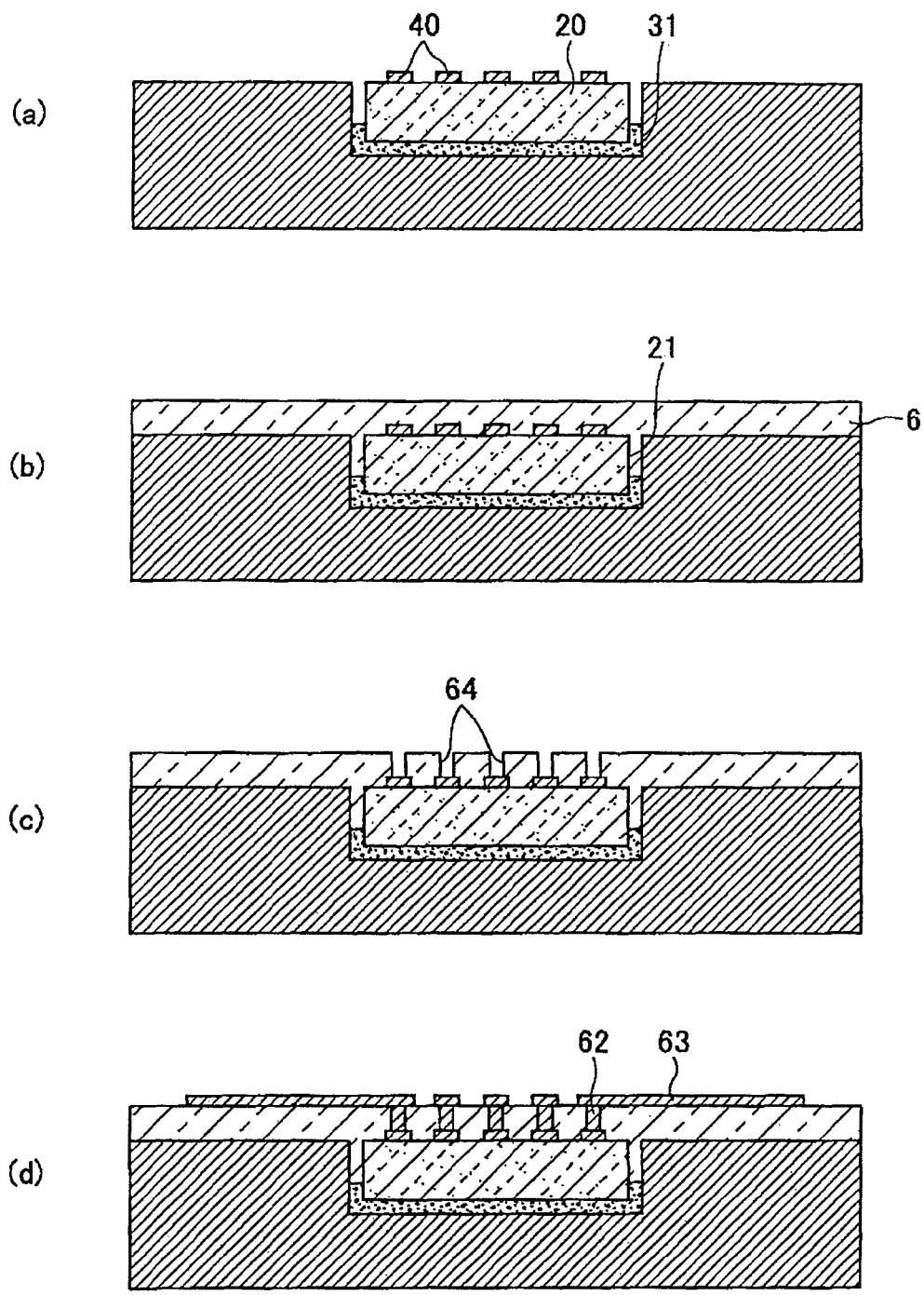
FIG. 14B is a drawing to schematically show the first manufacturing method of the semiconductor device according to the fourth modified example of the first embodiment of the invention (No. 2)
Figure 14C:
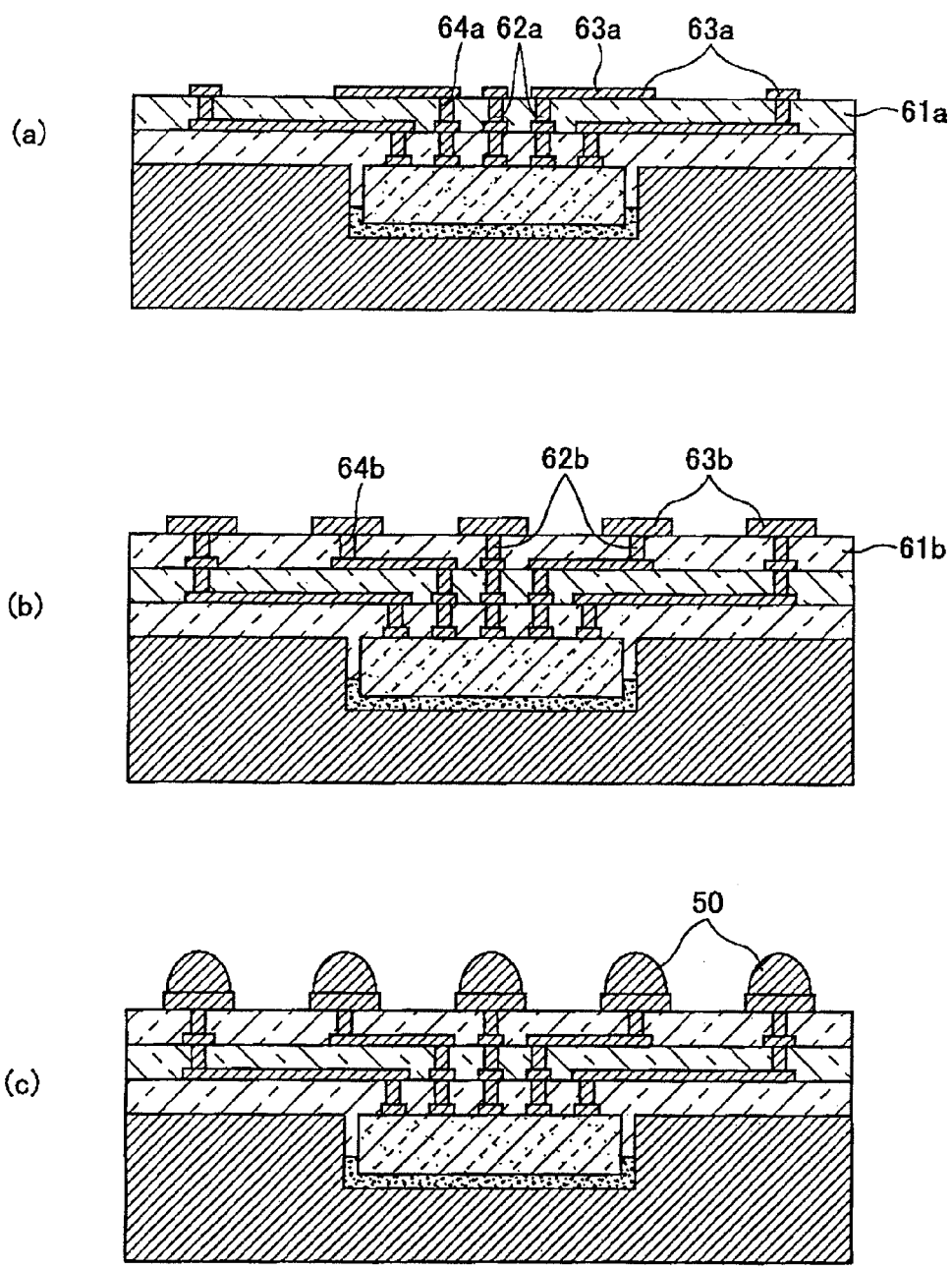
FIG. 14C is a drawing to schematically show the first manufacturing method of the semiconductor device according to the fourth modified example of the first embodiment of the invention (No. 3)

FIGS. 14A to 14C are drawings to schematically show the first manufacturing method of the semiconductor device according to the fourth modified example.

First, as shown in FIG. 14A (a), a support board 30 made of a copper plate having a thickness of 100 to 1000 μm, for example, is provided.

Next, in a fit hole forming step shown in FIG. 14A (b), a resist pattern made of a dry film resist 35 is formed on the support board 30 made of a copper plate. That is, the dry film resist 35 is deposited on the support board 30 and is exposed and is developed and the portion corresponding to the shape of the semiconductor chip 20 in the plan view is removed to form a resist pattern. The shape of this resist pattern corresponds to the shape of a fit hole 34 to fit the semiconductor chip 20, later formed in the support board 30.

Next, in the fit hole forming step shown in FIG. 14A (c), the fit hole 34 is formed by etching the support board 30 made of copper using cupric chloride as an etching liquid with the resist pattern made of the dry film resist 35 formed on the support board 30 as an etching protection film. At this time, the etching proceeds in the depth direction of the support board 30 made of copper. The etching time is managed, whereby when almost the same depth as the thickness of the semiconductor chip 20 fitted into the fit hole 34 is provided, the etching is completed to form the fit hole 34.

Next, the semiconductor chip 20 is fitted into the fit hole 34 and is adhered to the fit hole 34 (FIG. 14B (a)), an insulating layer 61 is formed so as to cover terminal electrodes 40 of the semiconductor chip 20 (FIG. 14B (b)), through holes 64 are formed, for example, using a laser (FIG. 14B (c)), and through electrodes 62 are formed and metal wiring 63 is formed, for example, according to the semiadditive process (FIG. 14B (d)). The steps shown in FIG. 14B (a) to 14B (d) are the same as those shown in FIG. 5B (a) to 5B (d) in the manufacturing method of the first modified example of the first embodiment.

Further, the steps in FIG. 14B (b) to 14B (d) are repeated twice to form a fan out section 60 (FIGS. 14C (a) and 14C (b)) and external terminal electrodes 50 (FIG. 14C (c)). The steps shown in FIG. 14C (a) to 14C (c) are the same as those shown in FIG. 5C (a) to 5C (c) in the manufacturing method of the first modified example of the first embodiment. In the first repetition, the insulating layer 61a, the through holes 64a, the through electrodes 62a, and the metal wiring 63a are formed, and in the second repetition, the insulating layer 61b, the through holes 64b, the through electrodes 62b, and the metal wiring 63b are formed as in the first modified example of the first embodiment.

As described above, according to the semiconductor device according to the fourth modified example, material in a wider range can be used for the support board, the terminal electrode spacing of the semiconductor chip can be made to correspond to general terminal spacing of C4 bump pitch, etc., and the semiconductor chip is fitted into the fit hole, whereby the mechanical strength and the heat conductivity can be more enhanced.

In the semiconductor device 10d according to the fourth modified example, the three layers of the insulating layer 61, the through electrodes 62, and the metal wiring 63 are used to ensure the fan out function. However, the number of the layers and the length of the metal wiring are not limited to them if arbitrary terminal electrodes 40 can be connected to the external terminal electrodes 50 without crossing each other.

In the manufacturing method of the semiconductor device according to the embodiment, the through electrodes 62, 62a, and 62b are formed and the metal wiring 63, 63a, and 63b are formed, for example, according to the semiadditive process, but the through electrodes 62, 62a, and 62b and the metal wiring 63, 63a, and 63b may be formed in separate steps.

Fifth Modified Example of First Embodiment

Next, a semiconductor device according to a fifth modified example of the first embodiment of the invention will be discussed with reference to FIG. 15.

Figure 15:
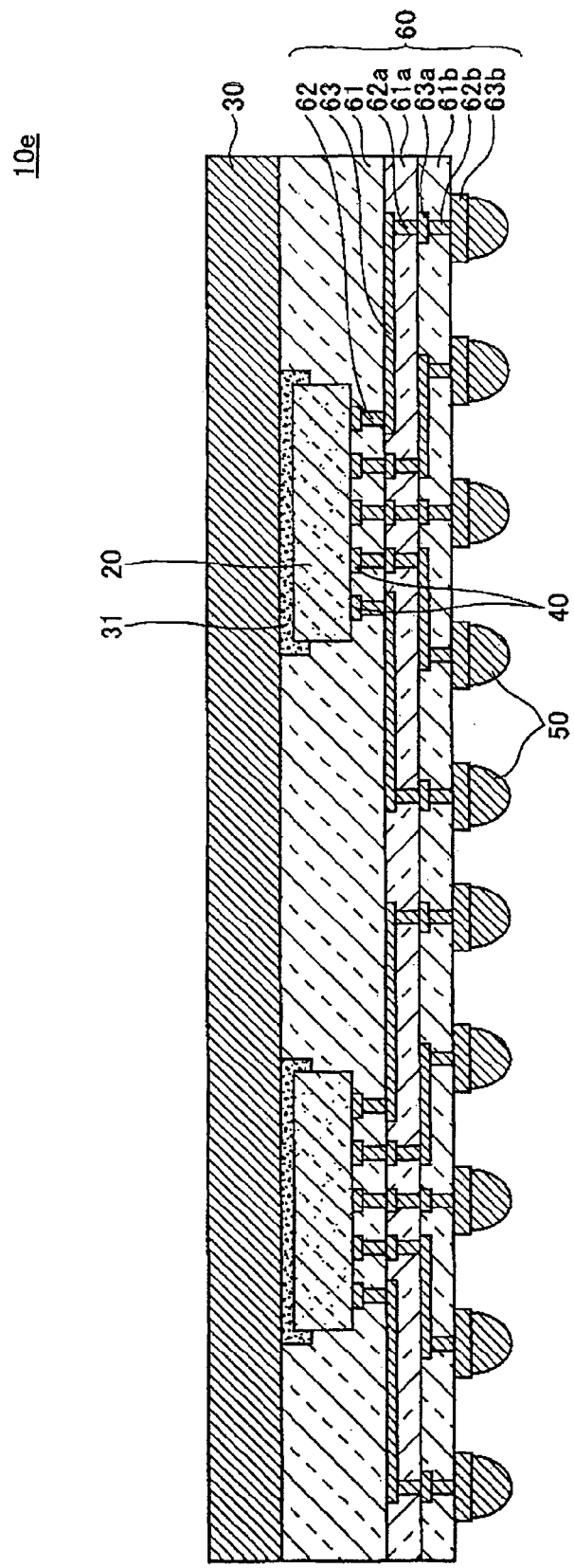
FIG. 15 is a sectional view to schematically show a semiconductor device according to a fifth modified example of the first embodiment of the invention.

FIG. 15 is a sectional view to schematically show the semiconductor device according to the fifth modified example.

The semiconductor device according to the fifth modified example differs from the semiconductor device 10 according to the first embodiment in that a plurality of semiconductor chips are mounted on one support board.

Referring to FIG. 15, unlike the semiconductor device according to the first embodiment wherein one semiconductor chip is mounted on one support board, a semiconductor device 10e according to the fifth modified example is characterized in that a plurality of semiconductor chips 20 are mounted on one support board 30.

As shown in FIG. 15, the semiconductor device 10e according to the fifth modified example has the semiconductor chips 20, the support board 30, terminal electrodes 40, external terminal electrodes 50, and a fan out section 60. The structures of the semiconductor chip 20 and the terminal electrodes 40 are the same as those of the semiconductor device 10 according to the first embodiment.

On the other hand, the opposite side of each of the semiconductor chips 20 to the side on which the terminal electrodes 40 are provided is adhered to the support board 30 with an adhesive 31. The number of the semiconductor chips 20 to be mounted on one support board 30 is not limited if it is two or more; for example, two semiconductor chips 20 can be mounted as in the semiconductor device 10e according to the fifth modified example. At this time, the area of the support board 30 in the plan view increases as compared with the semiconductor device 10 according to the first embodiment.

The external terminal electrodes 50 are formed corresponding to the terminal electrodes 40 of the semiconductor chips 20. Therefore, the number of the external terminal electrodes 50 increases as compared with the semiconductor device 10 according to the first embodiment.

The structure of the fan out section 60 in the thickness direction thereof has insulating layers 61, 61a, and 61b, through electrodes 62, 62a, and 62b, and metal wiring 63, 63a, and 63b as in the semiconductor device 10 according to the first embodiment. However, since a plurality of semiconductor chips 20 are mounted on one support board 30, the numbers of the through electrodes 62, 62a, and 62b and the metal wiring 63, 63a, and 63b increase in response to the number of the semiconductor chips 20 as compared with the semiconductor device 10 according to the first embodiment.

Further, the semiconductor chips 20 may be connected by the metal wiring 63, 63a, 63b.

As described above, according to the semiconductor device according to the fifth modified example, a plurality of semiconductor chips can be mounted in one semiconductor device and can be made compatible with the terminal spacing of a general wiring board.

Sixth Modified Example of First Embodiment

Next, a semiconductor device according to a sixth modified example of the first embodiment of the invention will be discussed with reference to FIG. 16.

Figure 16:
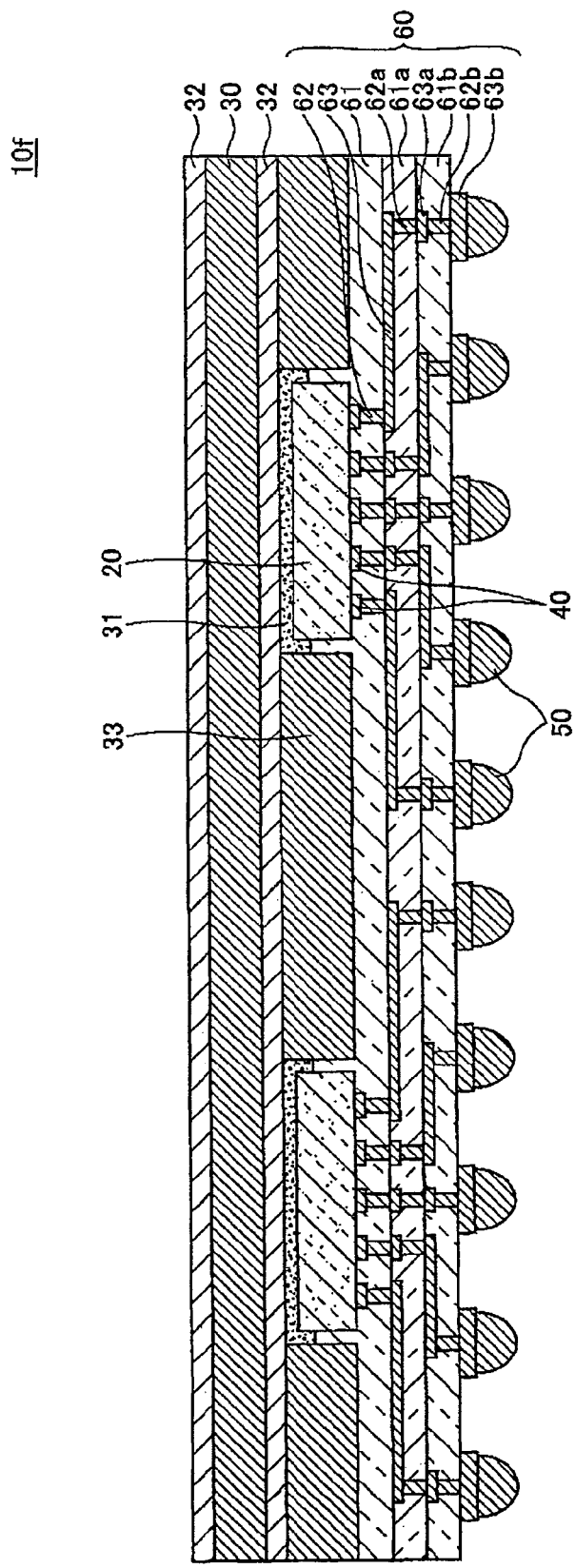
FIG. 16 is a sectional view to schematically show a semiconductor device according to a sixth modified example of the first embodiment of the invention.

FIG. 16 is a sectional view to schematically show the semiconductor device according to the sixth modified example.

The semiconductor device according to the sixth modified example differs from the semiconductor device 10a according to the first modified example of the first embodiment in that a plurality of semiconductor chips are mounted on one support board.

Referring to FIG. 16, unlike the semiconductor device according to the first modified example of the first embodiment wherein one semiconductor chip is mounted on one support board, a semiconductor device 10f according to the sixth modified example is characterized in that a plurality of semiconductor chips 20 are mounted on one support board 30.

As shown in FIG. 16, the semiconductor device 10f according to the sixth modified example has the semiconductor chips 20, the support board 30, terminal electrodes 40, external terminal electrodes 50, and a fan out section 60. The structures of the semiconductor chip 20 and the terminal electrodes 40 are the same as those of the semiconductor device 10a according to the first modified example of the first embodiment. On the other hand, the support board 30, the external terminal electrodes 50, and the fan out section 60 are modified so as to become the same correspondence as the semiconductor device 10e according to the fifth modified example of the first embodiment has a structure wherein a plurality of semiconductor chips 20 are mounted in the semiconductor device 10 according to the first embodiment.

Further, the semiconductor chips 20 may be connected by metal wiring 63, 63a, 63b.

As described above, according to the semiconductor device according to the sixth modified example, a plurality of semiconductor chips can be mounted in one semiconductor device and can be made compatible with the terminal spacing of a general wiring board.

Seventh Modified Example of First Embodiment

Next, a semiconductor device according to a seventh modified example of the first embodiment of the invention will be discussed with reference to FIG. 17.

Figure 17:
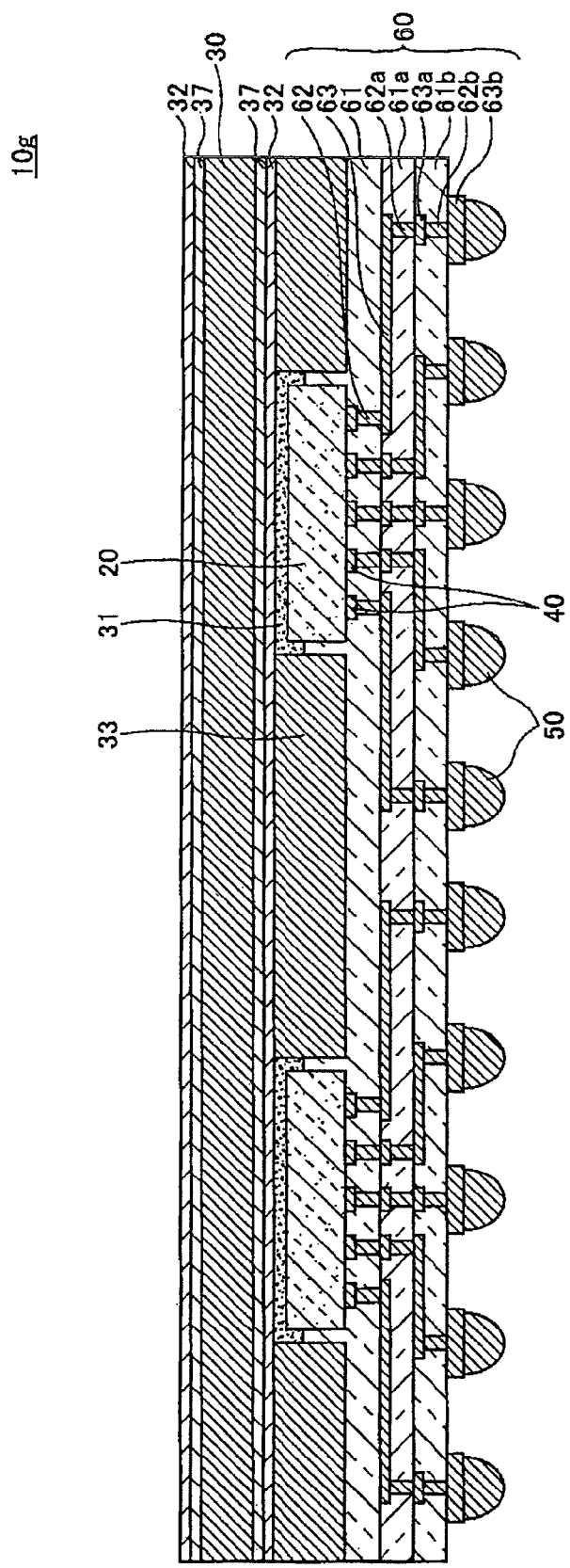
FIG. 17 is a sectional view to schematically show a semiconductor device according to a seventh modified example of the first embodiment of the invention.

FIG. 17 is a sectional view to schematically show the semiconductor device according to the seventh modified example.

The semiconductor device according to the seventh modified example differs from the semiconductor device 10b according to the second modified example of the first embodiment in that a plurality of semiconductor chips are mounted on one support board.

Referring to FIG. 17, unlike the semiconductor device according to the second modified example of the first embodiment wherein one semiconductor chip is mounted on one support board, a semiconductor device 10g according to the seventh modified example is characterized in that a plurality of semiconductor chips 20 are mounted on one support board 30.

As shown in FIG. 17, the semiconductor device 10g according to the seventh modified example has the semiconductor chips 20, the support board 30, terminal electrodes 40, external terminal electrodes 50, and a fan out section 60. The structures of the semiconductor chip 20 and the terminal electrodes 40 are the same as those of the semiconductor device 10b according to the second modified example of the first embodiment. On the other hand, the support board 30, the external terminal electrodes 50, and the fan out section 60 are modified so as to become the same correspondence as the semiconductor device 10e according to the fifth modified example of the first embodiment has a structure wherein a plurality of semiconductor chips 20 are mounted in the semiconductor device 10 according to the first embodiment.

Further, the semiconductor chips 20 may be connected by metal wiring 63, 63a, 63b.

As described above, according to the semiconductor device according to the seventh modified example, a plurality of semiconductor chips can be mounted in one semiconductor device and can be made compatible with the terminal spacing of a general wiring board.

Eighth Modified Example of First Embodiment

Next, a semiconductor device according to an eighth modified example of the first embodiment of the invention will be discussed with reference to FIG. 18.

Figure 18:
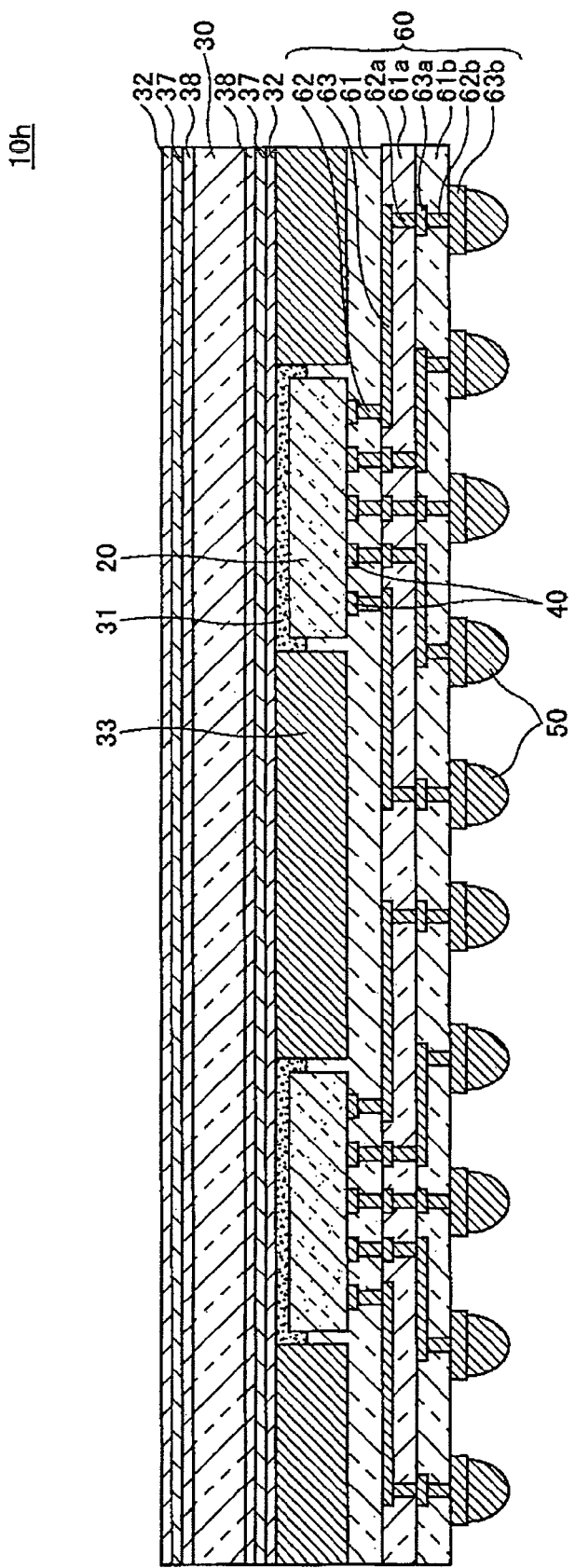
FIG. 18 is a sectional view to schematically show a semiconductor device according to an eighth modified example of the first embodiment of the invention.

FIG. 18 is a sectional view to schematically show the semiconductor device according to the eighth modified example.

The semiconductor device according to the eighth modified example differs from the semiconductor device 10c according to the third modified example of the first embodiment in that a plurality of semiconductor chips are mounted on one support board.

Referring to FIG. 18, unlike the semiconductor device according to the third modified example of the first embodiment wherein one semiconductor chip is mounted on one support board, a semiconductor device 10h according to the eighth modified example is characterized in that a plurality of semiconductor chips 20 are mounted on one support board 30.

As shown in FIG. 18, the semiconductor device 10h according to the eighth modified example has the semiconductor chips 20, the support board 30, terminal electrodes 40, external terminal electrodes 50, and a fan out section 60. The structures of the semiconductor chip 20 and the terminal electrodes 40 are the same as those of the semiconductor device 10c according to the third modified example of the first embodiment. On the other hand, the support board 30, the external terminal electrodes 50, and the fan out section 60 are modified so as to become the same correspondence as the semiconductor device 10e according to the fifth modified example of the first embodiment has a structure wherein a plurality of semiconductor chips 20 are mounted in the semiconductor device 10 according to the first embodiment.

Further, the semiconductor chips 20 may be connected by metal wiring 63, 63a, 63b.

As described above, according to the semiconductor device according to the eighth modified example, a plurality of semiconductor chips can be mounted in one semiconductor device and can be made compatible with the terminal spacing of a general wiring board.

Ninth Modified Example of First Embodiment

Next, a semiconductor device according to a ninth modified example of the first embodiment of the invention will be discussed with reference to FIG. 19.

Figure 19:
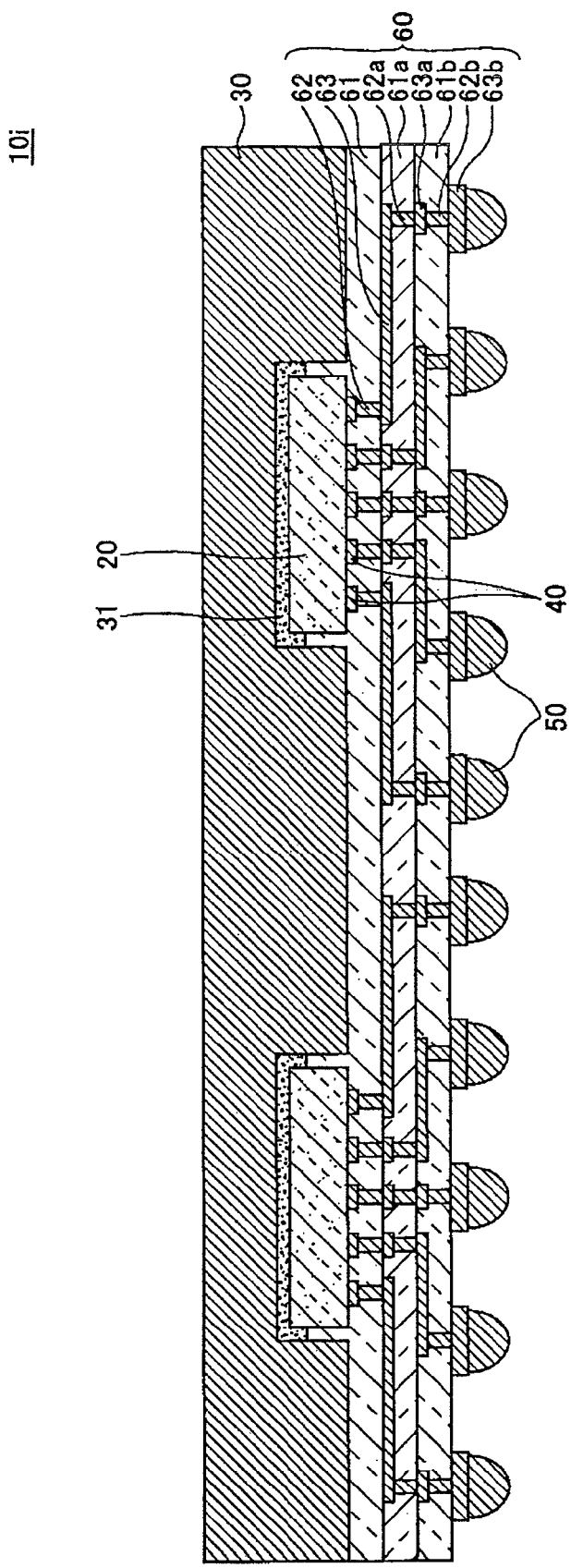
FIG. 19 is a sectional view to schematically show a semiconductor device according to a ninth modified example of the first embodiment of the invention.

FIG. 19 is a sectional view to schematically show the semiconductor device according to the ninth modified example.

The semiconductor device according to the ninth modified example differs from the semiconductor device 10d according to the fourth modified example of the first embodiment in that a plurality of semiconductor chips are mounted on one support board.

Referring to FIG. 19, unlike the semiconductor device according to the fourth modified example of the first embodiment wherein one semiconductor chip is mounted on one support board, a semiconductor device 10i according to the ninth modified example is characterized in that a plurality of semiconductor chips 20 are mounted on one support board 30.

As shown in FIG. 19, the semiconductor device 10i according to the ninth modified example has the semiconductor chips 20, the support board 30, terminal electrodes 40, external terminal electrodes 50, and a fan out section 60. The structures of the semiconductor chip 20 and the terminal electrodes 40 are the same as those of the semiconductor device 10d according to the fourth modified example of the first embodiment. On the other hand, the support board 30, the external terminal electrodes 50, and the fan out section 60 are modified so as to become the same correspondence as the semiconductor device 10e according to the fifth modified example of the first embodiment has a structure wherein a plurality of semiconductor chips 20 are mounted in the semiconductor device 10 according to the first embodiment.

Further, the semiconductor chips 20 may be connected by metal wiring 63, 63a, 63b.

As described above, according to the semiconductor device according to the ninth modified example, a plurality of semiconductor chips can be mounted in one semiconductor device and can be made compatible with the terminal spacing of a general wiring board.

Second Embodiment

Next, a wiring board according to a second embodiment of the invention will be discussed with reference to FIG. 20.

Figure 20:
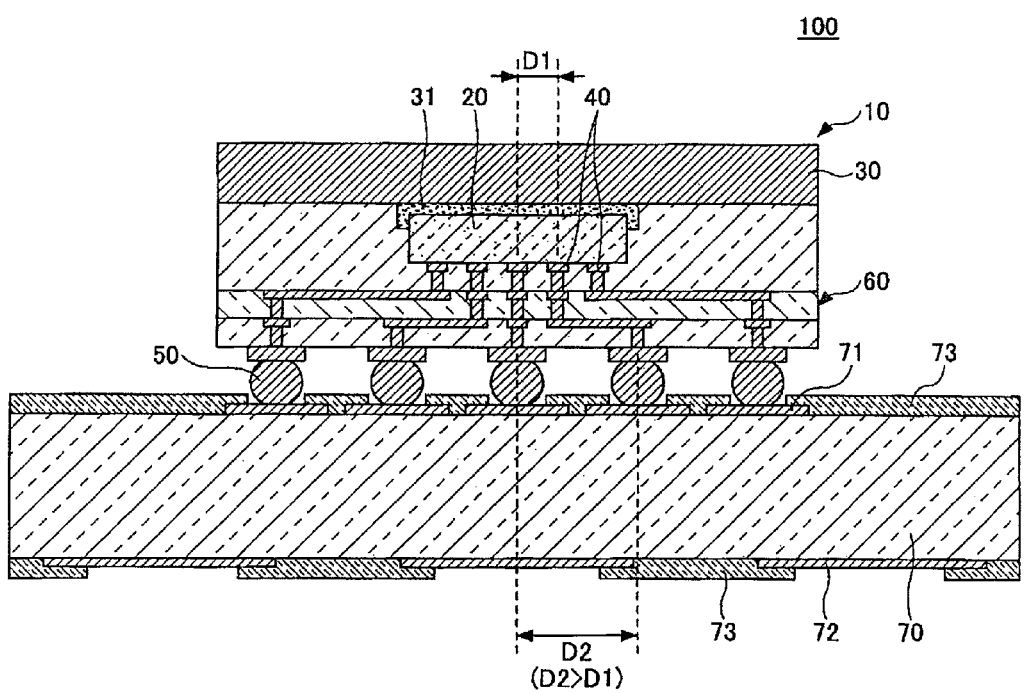
FIG. 20 is a sectional view to schematically show a wiring board according to a second embodiment of the invention.

FIG. 20 is a sectional view to schematically show the wiring board according to the second embodiment of the invention.

As shown in FIG. 20, a wiring board 100 according to the embodiment has a semiconductor device 10 and a wiring board substrate 70.

The semiconductor device 10 is the same as the semiconductor device 10 according to the first embodiment and has a semiconductor chip 20, a support board 30, terminal electrodes 40, external terminal electrodes 50, and a fan out section 60. First spacing D1, spacing between the adjacent terminal electrodes 40, and second spacing D2, spacing between the adjacent external terminal electrodes 50, have the relation D1<D2. D1 is not limited; however, it is 50 to 100 μm, for example. D2 is not limited; however, it is 150 to 180 μm, for example.

The wiring board substrate 70 is a substrate forming a wiring board to mount the semiconductor device 10. It has wiring board terminal electrodes 71 provided on the surface of the wiring board substrate 70 in a one-to-one correspondence with the external terminal electrodes 50 of the semiconductor device 10, wiring board back terminal electrodes 72 provided on the back of the wiring board substrate 70 and electrically connected to the wiring board terminal electrodes 71, and insulating layers 73 provided on the surface and the back of the wiring board substrate 70. Spacing between the wiring board terminal electrodes 71 is equal to the second spacing D2, the spacing between the adjacent external terminal electrodes 50 of the semiconductor device 10 and is 150 to 180 μm, general terminal spacing of C4 bump pitch, etc. That is, the wiring board substrate 70 is a substrate of a wiring board used widely in the related art.

The external terminal electrodes 50 of the semiconductor device 10 are soldered to and electrically connected to the wiring board terminal electrodes 71 of the wiring board substrate 70. That is, the wiring board 100 is electrically connected to the semiconductor device 10.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

First Modified Example of Second Embodiment

Next, a wiring board according to a first modified example of the second embodiment of the invention will be discussed with FIG. 21.

Figure 21:
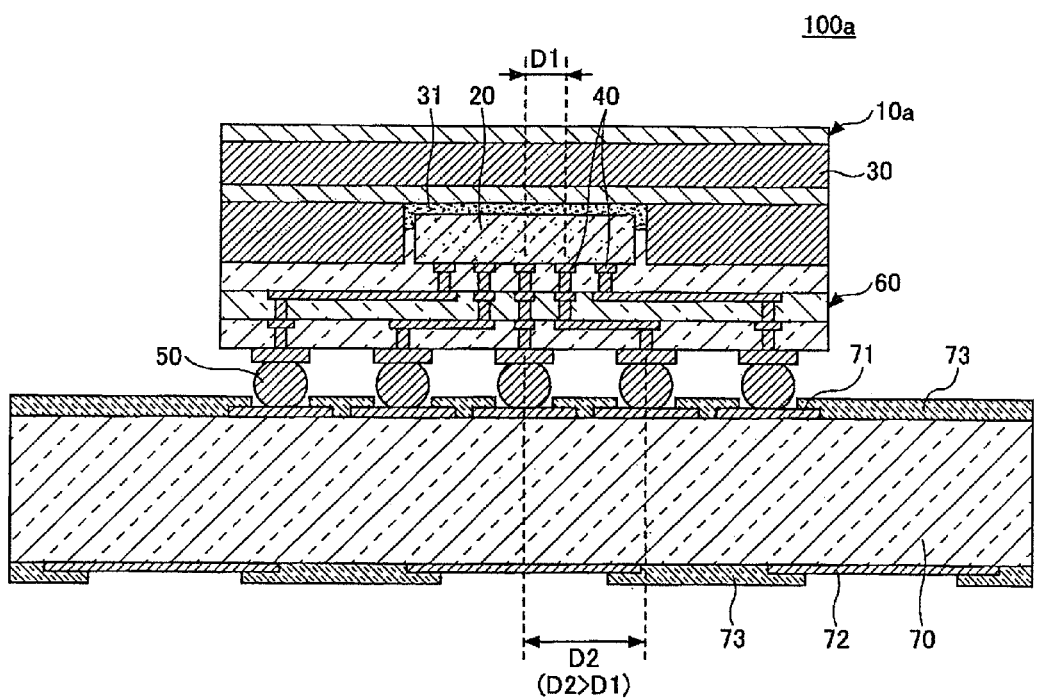
FIG. 21 is a sectional view to schematically show a wiring board according to a first modified example of the second embodiment of the invention.

FIG. 21 is a sectional view to schematically show the wiring board according to the modified example.

The wiring board according to the modified example differs from the wiring board according to the second embodiment in that a semiconductor device mounted on the wiring board is the semiconductor device 10a according to the first modified example of the first embodiment.

Referring to FIG. 21, unlike the wiring board according to the second embodiment wherein the semiconductor device 10 according to the first embodiment is mounted, a wiring board 100a according to the modified example is characterized in that the semiconductor device 10a according to the first modified example of the first embodiment is mounted.

As shown in FIG. 21, the wiring board 100a according to the modified example has a semiconductor device 10a and a wiring board substrate 70.

The semiconductor device 10a is the same as the semiconductor device 10a according to the first modified example of the first embodiment and has terminal electrodes 40 placed with first spacing D1 and external terminal electrodes 50 placed with second spacing D2 (>D1). The wiring board substrate 70 has wiring board terminal electrodes 71 placed with the second spacing D2 (>D1) in a one-to-one correspondence with the external terminal electrodes 50 of the semiconductor device 10a. The external terminal electrodes 50 and the wiring board terminal electrodes 71 are electrically connected as in the second embodiment.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

Second Modified Example of Second Embodiment

Next, a wiring board according to a second modified example of the second embodiment of the invention will be discussed with FIG. 22.

Figure 22:
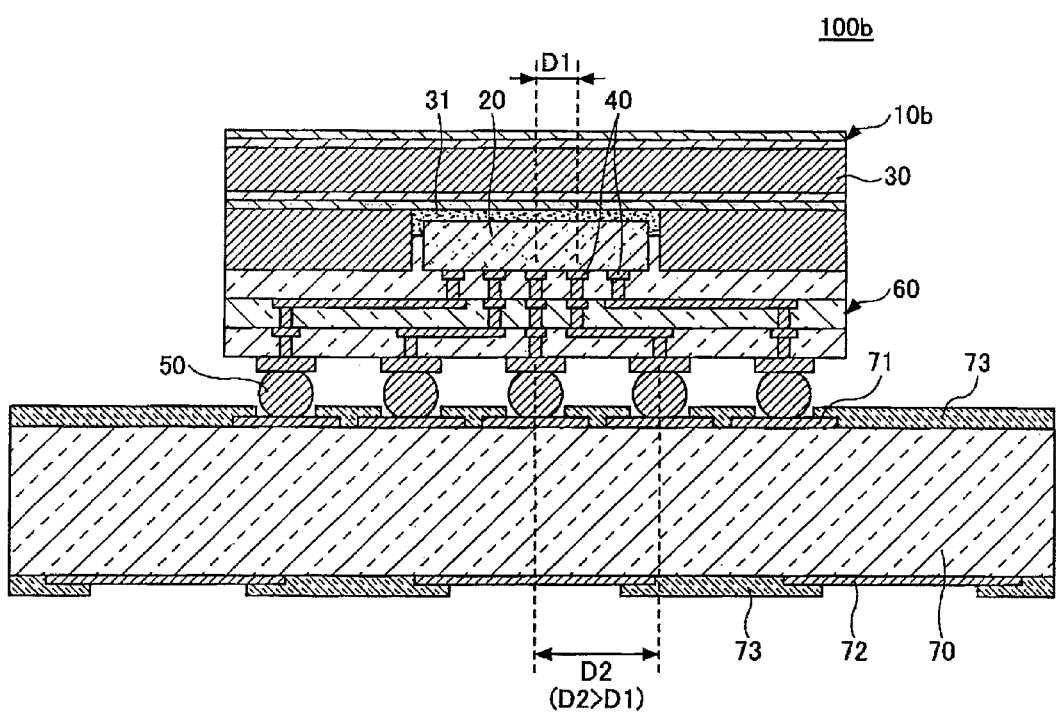
FIG. 22 is a sectional view to schematically show a wiring board according to a second modified example of the second embodiment of the invention.

FIG. 22 is a sectional view to schematically show the wiring board according to the modified example.

The wiring board according to the modified example differs from the wiring board according to the second embodiment in that a semiconductor device mounted on the wiring board is the semiconductor device 10b according to the second modified example of the first embodiment.

Referring to FIG. 22, unlike the wiring board according to the second embodiment wherein the semiconductor device 10 according to the first embodiment is mounted, a wiring board 100b according to the modified example is characterized in that the semiconductor device 10b according to the second modified example of the first embodiment is mounted.

As shown in FIG. 22, the wiring board 100b according to the modified example has a semiconductor device 10b and a wiring board substrate 70.

The semiconductor device 10b is the same as the semiconductor device 10b according to the second modified example of the first embodiment and has terminal electrodes 40 placed with first spacing. D1 and external terminal electrodes 50 placed with second spacing D2 (>D1). The wiring board substrate 70 has wiring board terminal electrodes 71 placed with the second spacing D2 (>D1) in a one-to-one correspondence with the external terminal electrodes 50 of the semiconductor device 10b. The external terminal electrodes 50 and the wiring board terminal electrodes 71 are electrically connected as in the second embodiment.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

Third Modified Example of Second Embodiment

Next, a wiring board according to a third modified example of the second embodiment of the invention will be discussed with FIG. 23.

Figure 23:
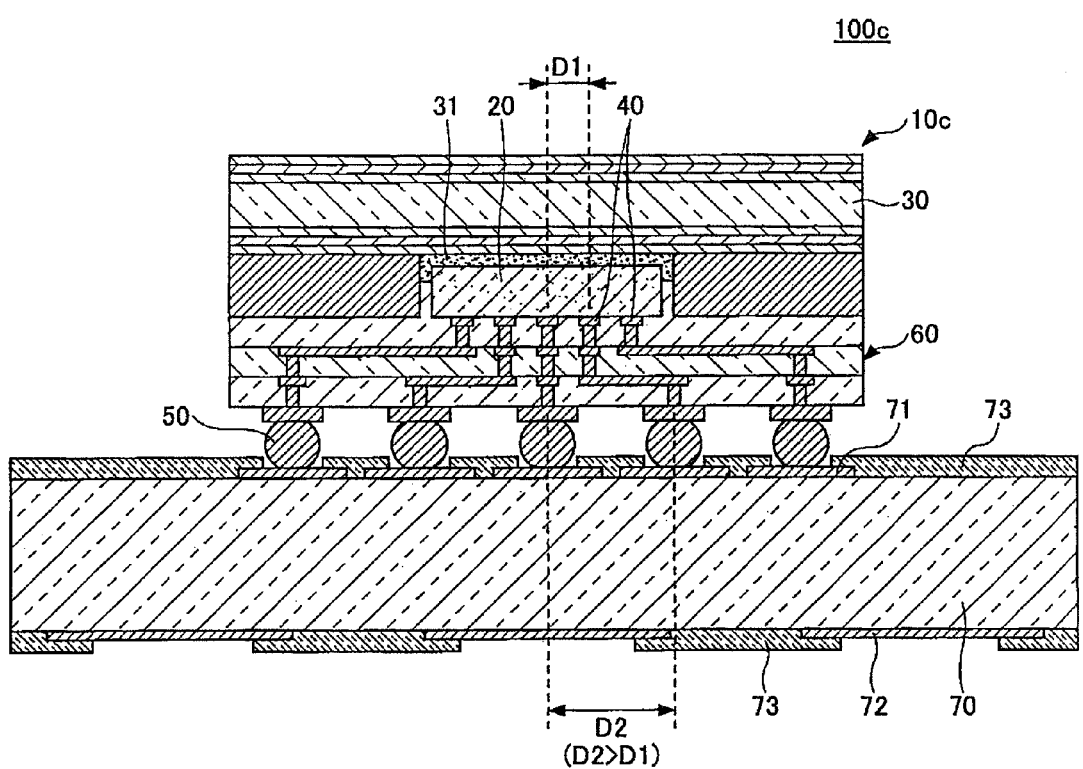
FIG. 23 is a sectional view to schematically show a wiring board according to a third modified example of the second embodiment of the invention.

FIG. 23 is a sectional view to schematically show the wiring board according to the modified example.

The wiring board according to the modified example differs from the wiring board according to the second embodiment in that a semiconductor device mounted on the wiring board is the semiconductor device 10c according to the third modified example of the first embodiment.

Referring to FIG. 23, unlike the wiring board according to the second embodiment wherein the semiconductor device 10 according to the first embodiment is mounted, a wiring board 100c according to the modified example is characterized in that the semiconductor device 10c according to the third modified example of the first embodiment is mounted.

As shown in FIG. 23, the wiring board 100c according to the modified example has a semiconductor device 10c and a wiring board substrate 70.

The semiconductor device 10c is the same as the semiconductor device 10c according to the third modified example of the first embodiment and has terminal electrodes 40 placed with first spacing D1 and external terminal electrodes 50 placed with second spacing D2 (>D1). The wiring board substrate 70 has wiring board terminal electrodes 71 placed with the second spacing D2 (>D1) in a one-to-one correspondence with the external terminal electrodes 50 of the semiconductor device 10c. The external terminal electrodes 50 and the wiring board terminal electrodes 71 are electrically connected as in the second embodiment.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

Fourth Modified Example of Second Embodiment

Next, a wiring board according to a fourth modified example of the second embodiment of the invention will be discussed with FIG. 24.

Figure 24:
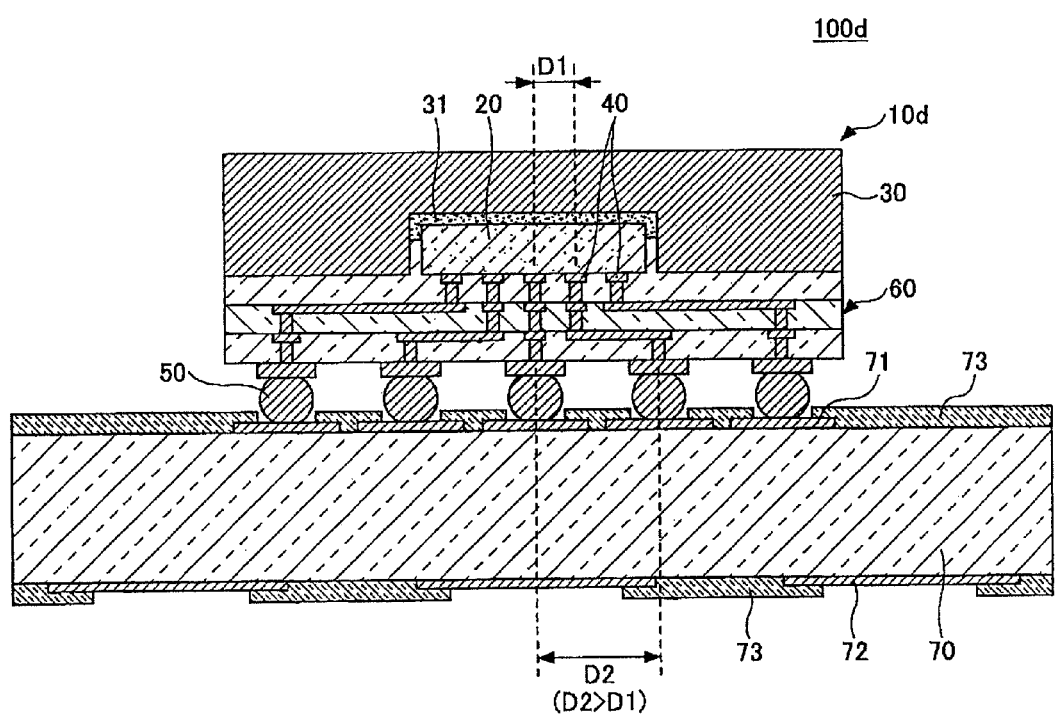
FIG. 24 is a sectional view to schematically show a wiring board according to a fourth modified example of the second embodiment of the invention.

FIG. 24 is a sectional view to schematically show the wiring board according to the modified example.

The wiring board according to the modified example differs from the wiring board according to the second embodiment in that a semiconductor device mounted on the wiring board is the semiconductor device 10d according to the fourth modified example of the first embodiment.

Referring to FIG. 24, unlike the wiring board according to the second embodiment wherein the semiconductor device 10 according to the first embodiment is mounted, a wiring board 100d according to the modified example is characterized in that the semiconductor device 10d according to the fourth modified example of the first embodiment is mounted.

As shown in FIG. 24, the wiring board 100d according to the modified example has a semiconductor device 10d and a wiring board substrate 70.

The semiconductor device 10d is the same as the semiconductor device 10d according to the fourth modified example of the first embodiment and has terminal electrodes 40 placed with first spacing D1 and external terminal electrodes 50 placed with second spacing D2 (>D1). The wiring board substrate 70 has wiring board terminal electrodes 71 placed with the second spacing D2 (>D1) in a one-to-one correspondence with the external terminal electrodes 50 of the semiconductor device 10d. The external terminal electrodes 50 and the wiring board terminal electrodes 71 are electrically connected as in the second embodiment.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

Fifth Modified Example of Second Embodiment

Next, a wiring board according to a fifth modified example of the second embodiment of the invention will be discussed with FIG. 25.

Figure 25:
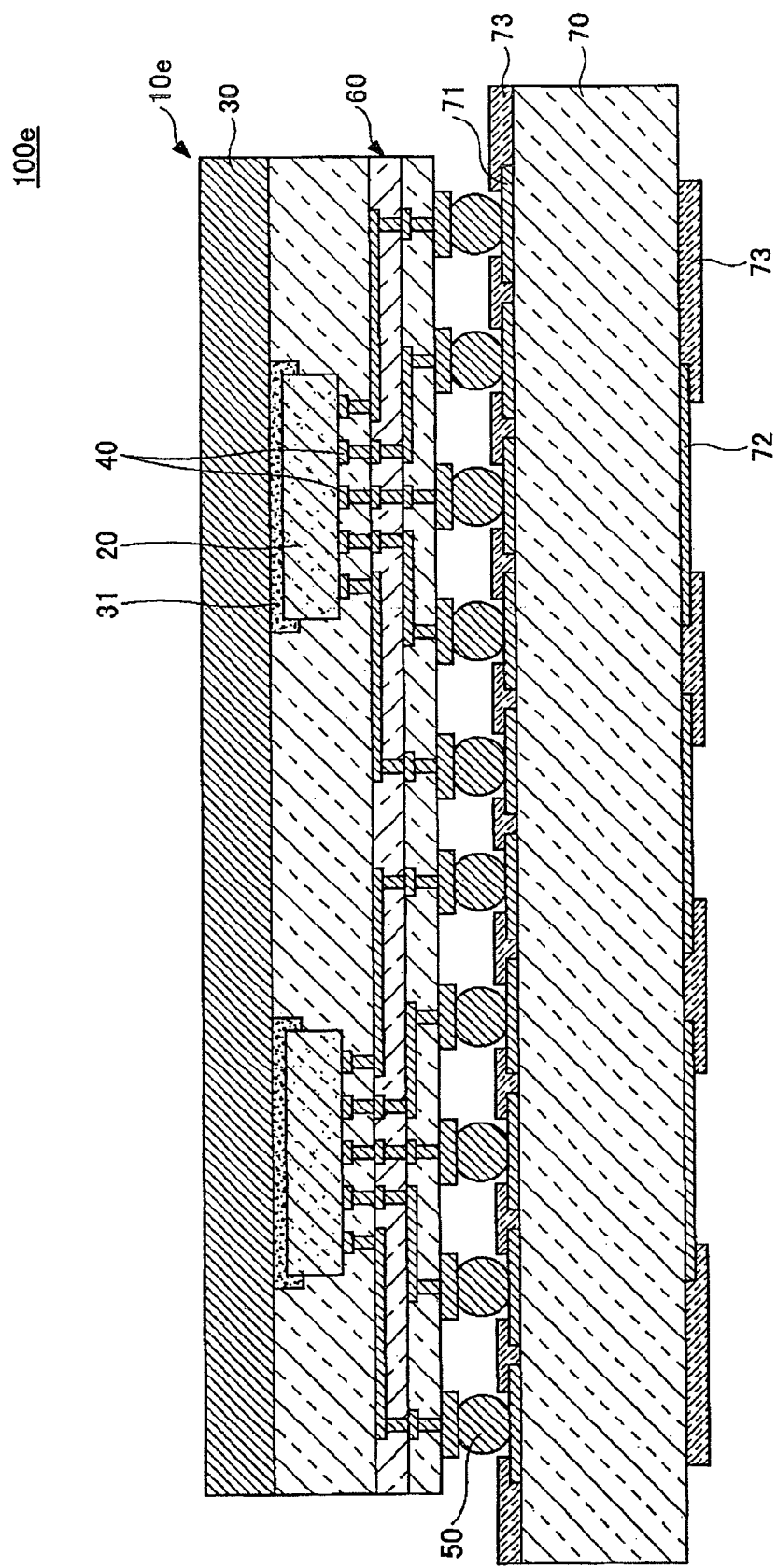
FIG. 25 is a sectional view to schematically show a wiring board according to a fifth modified example of the second embodiment of the invention.

FIG. 25 is a sectional view to schematically show the wiring board according to the modified example.

The wiring board according to the modified example differs from the wiring board according to the second embodiment in that a semiconductor device mounted on the wiring board is the semiconductor device 10e according to the fifth modified example of the first embodiment.

Referring to FIG. 25, unlike the wiring board according to the second embodiment wherein the semiconductor device 10 according to the first embodiment is mounted, a wiring board 100e according to the modified example is characterized in that the semiconductor device 10e according to the fifth modified example of the first embodiment is mounted.

As shown in FIG. 25, the wiring board 100e according to the modified example has a semiconductor device 10e and a wiring board substrate 70.

The semiconductor device 10e is the same as the semiconductor device 10e according to the fifth modified example of the first embodiment and has terminal electrodes 40 placed with first spacing D1 and external terminal electrodes 50 placed with second spacing D2 (>D1). The wiring board substrate 70 has wiring board terminal electrodes 71 placed with the second spacing D2 (>D1) in a one-to-one correspondence with the external terminal electrodes 50 of the semiconductor device 10e. The external terminal electrodes 50 and the wiring board terminal electrodes 71 are electrically connected as in the second embodiment.

As described above, according to the wiring board according to the second embodiment, the semiconductor chip having the terminal electrodes disposed with narrower spacing than the general terminal spacing of C4 bump pitch, etc., can be mounted on a wiring board having connection terminals disposed with the general terminal spacing.

What is claimed is:

1. A semiconductor device manufacturing method comprising:
   a semiconductor chip mounting step of mounting a semiconductor chip on a support board so as to expose a side of the semiconductor chip on which a plurality of terminal electrodes are provided;
   an insulating layer forming step of forming an insulating layer so as to cover the side of the semiconductor chip on which the terminal electrodes are provided;
   a through electrode forming step of forming through electrodes which connect to the terminal electrodes and pierce the insulating layer;
   a metal wiring forming step of forming metal wiring connecting to the through electrodes on the insulating layer; and
   an external terminal electrode forming step of forming external terminal electrodes for connecting the metal wiring to the outside on the metal wiring,
   wherein spacing between the adjacent external terminal electrodes is larger than spacing between the adjacent terminal electrodes, and
   wherein said semiconductor chip mounting step comprises:
   a metal film forming step of forming a first metal film on the support board and a second metal film on the first metal film;
   a fit hole forming step of forming the second metal film with a fit hole to fit the semiconductor chip; and
   a fit and adhesion step of fitting the semiconductor chip into the fit hole and adhering the semiconductor chip to the fit hole with an adhesive,
   wherein the support board is made of copper, and the first metal film is made of gold, and
   wherein a nickel treatment layer is disposed between the support board and the first metal film.

2. The semiconductor device manufacturing method as claimed in claim 1 wherein the fit hole forming step is to deposit a dry film resist on the second metal film, expose and develop the dry film resist to form a resist pattern corresponding to the fit hole, and etch the second metal film formed with the resist pattern.

3. The semiconductor device manufacturing method as claimed in claim 1 wherein the second metal film is copper.

* * * * *